(12) United States Patent
Lillington et al.

(10) Patent No.: US 7,483,498 B2
(45) Date of Patent: Jan. 27, 2009

(54) FREQUENCY CONTENT SEPARATION USING COMPLEX FREQUENCY SHIFTING CONVERTERS

(75) Inventors: John Lillington, Isle of Wight (GB); Antonio R. Russo, Southampton (GB)

(73) Assignee: R.F. Engines Limited, Isle of Wight (GB)

( * ) Notice: Subject to any disclaimer, the term of this patent is extended or adjusted under 35 U.S.C. 154(b) by 434 days.

(21) Appl. No.: 10/520,160

(22) PCT Filed: Jul. 1, 2003

(86) PCT No.: PCT/GB03/02821

§ 371 (c)(1),
(2), (4) Date: Jan. 25, 2005

(87) PCT Pub. No.: WO2004/006434

PCT Pub. Date: Jan. 15, 2004

(65) Prior Publication Data

US 2005/0249313 A1     Nov. 10, 2005

(30) Foreign Application Priority Data

Jul. 4, 2002   (GB) ................. 0215502.6

(51) Int. Cl.
*H04L 27/06* (2006.01)

(52) U.S. Cl. ............... 375/344; 375/316; 375/343; 375/345; 375/332; 455/188.1; 455/314; 455/315

(58) Field of Classification Search .......... 375/316, 375/335, 339, 344–45, 229, 295, 147, 332; 348/731

See application file for complete search history.

(56) References Cited

U.S. PATENT DOCUMENTS

| | | | | |
|---|---|---|---|---|
| 6,101,226 A | * | 8/2000 | Ohta et al. | 375/332 |
| 6,215,828 B1 | | 4/2001 | Signell et al. | 375/316 |
| 6,714,263 B2 | * | 3/2004 | Cowley | 348/731 |
| 6,944,238 B2 | * | 9/2005 | Garceran et al. | 375/295 |
| 7,236,212 B2 | * | 6/2007 | Carr et al. | 348/726 |
| 2001/0022811 A1 | * | 9/2001 | Lillington | 375/229 |
| 2006/0171492 A1 | * | 8/2006 | Behzad et al. | 375/343 |

FOREIGN PATENT DOCUMENTS

| | | |
|---|---|---|
| EP | 1 168 646 A2 | 1/2002 |
| WO | 01/65692 | 9/2001 |

* cited by examiner

*Primary Examiner*—Shuwang Liu
*Assistant Examiner*—Hirdepal Singh
(74) *Attorney, Agent, or Firm*—Nixon & Vanderhye P.C.

(57) ABSTRACT

A frequency separating system is described utilising tuneable frequency shifting complex converters in which the centre frequency of the band extracted and the bandwidth extracted can be varied depending upon the parameters chosen by the user. A single output band may contain multiple target carrier signals for separation using fine-tuning shaping filters. The local oscillators provide a stream of coefficient values for multiplying the digital signal sample values to perform part of the frequency extraction operation. These local oscillators may be numerically controlled oscillators with the stream of generated co-efficient values being selected from different sets of such coefficient values depending upon the desired frequency extraction.

10 Claims, 25 Drawing Sheets

Fig. 16 - Part 1

Fig. 16 - Part 2

FREQUENCY CONTENT SEPARATION USING COMPLEX FREQUENCY SHIFTING CONVERTERS

This application is the US national phase of international application PCT/GB2003/002821 filed 1 Jul. 2003 which designated the U.S. and claims benefit of GB 0215502.6, dated 4 Jul. 2002, the entire content of which is hereby incorporated by reference.

This invention relates to the field of signal processing. More particularly, this invention relates to frequency content separating an input signal using complex frequency shifting converters.

It is known from International Published Application No. WO-A-01/65692 to provide frequency content separation using pairs of complex up-converters and complex down-converters in a sequence of stages with samples being interleaved between stages (this technique is hereafter referred to as PFT, pipelined frequency transform). This known arrangement provides a hardware efficient way of frequency content separating an input signal.

Whilst the above mentioned frequency separation system has many advantages over other systems seeking to provide frequency content separation, it does suffer from the limitation of providing bands which are only a power of two fractions of the initial input signal spectrum and can only be centred at fixed points within the input signal spectrum. In important practical situations, these limitations can be a significant disadvantage.

Conventional frequency splitting techniques employ a number of individual digital down-converters. This soon becomes expensive in terms of hardware utilisation and cost as the number of channels required increases.

Viewed from one aspect the present invention provides apparatus for frequency content separating an input signal, said apparatus comprising:

a plurality of frequency separating stages, each frequency separating stage including at least one complex frequency shifting converter operable to receive a complex input signal representing an input bandwidth extending from $-Fs/2$ to $+Fs/2$ and to output a frequency shifted complex output signal representing a portion of said input bandwidth, wherein at least one complex frequency shifting converter in at least one of said plurality of frequency separating stages is a tuned complex frequency shifting converter having a frequency shifting characteristic operable to output a frequency shifted complex output signal representing a portion of said input bandwidth centred other than at $-Fs/4$ or $+Fs/4$.

The invention recognises that whilst the known approach using a regular symmetric splitting of each separated band in half at each separation stage may be viewed as a theoretically optimum technique for breaking down the input spectrum to a fine level with a low number of stages and hardware requirement, in practice better real-life performance matched to practical frequency content separation requirements may be achieved by providing one or more tuned complex frequency shifting converters in the separating stages which are not centred about the same points as a symmetric separating stage that would operate upon the same input signal. At least preferred embodiments of the present technique provide an increase in efficiency and cost effectiveness over the prior approach.

Preferred embodiments of the invention also provide that said tuned complex frequency shifting converter has a frequency shifting characteristic operable to output a frequency shifted complex output signal representing a portion of said input bandwidth having an output bandwidth between $Fs/2$ and $3Fs/4$.

This preferred aspect of the invention recognises that as well as it being advantageous in some circumstances to vary the frequency separated bands centre points away from a symmetric tree-like structure, it is also advantageous in many real-life situations to extend the bandwidth encompassed within a frequency separated output to be greater than half the input bandwidth for that particular complex frequency shifting converter. This is particularly useful in avoiding a potential problem that can arise with a non-symmetric tree in that certain target bands of interest may become unreachable if only one target band may be contained within the standard bandwidth of a complex frequency shifting converter.

It will be appreciated that preferred embodiments of the invention provide a plurality of output signals from the frequency separating stages that differ in size and/or are non-contiguous. This type of output contrasts markedly with the highly symmetric regular type of output of the known system described above and is better suited to many types of real life application.

In order to reduce the hardware requirements of the system, preferred embodiments serve to decimate and interleave the complex output signals between frequency separating stages prior to subsequent processing.

In preferred embodiments of the invention the tuned frequency shifting complex converter includes a local oscillator operable to generate one or more time-varying coefficient signals by which sample values are multiplied as part of the frequency separation operation.

The tuneability of such frequency shifting complex converters may be conveniently provided by arranging that such local oscillators are operable to generate a selectable one of a plurality of different streams of time varying coefficient signals, each of these different streams corresponding to a different local oscillator frequency which will in turn serve to separate a different portion of the input signal bandwidth.

It will be appreciated that the tuned frequency shifting complex converters may equally provide up-converter or down-converter functionality depending on the particular circumstances.

Preferred embodiments of the invention may mix symmetric and non-symmetric separation stages to produce an overall system having improved performance. As an example, the early frequency separating stages may be symmetric with the tuned stages appearing when more fine-levelled frequency separation is required. Furthermore, frequency paths leading to unused portion of the spectrum need not be calculated, thus the unused hardware and/or clock cycles translate into power savings.

Whilst the frequency separating stages using their frequency shifting complex converters may separate out particular target bandwidth portions of the input to the system, the requirement to provide a hardware efficient system will to some degree restrict the points about which separated bands may be centred and the widths of those bands such that in preferred embodiments it is advantageous to provide that output signals are passed through respective fine tuning stages that serve to extract the target carrier signals.

Such fine tuning stages may be provided with relatively long delay lines used as filters that may more flexibly tune to a particular frequency and with a particular frequency response as required by the target carrier signal being extracted.

The invention also provides a method of selecting operating characteristics of a plurality of frequency separating stages as set out in the accompanying claims.

Example embodiments will now be described, by way of example only, with reference to the accompanying drawings in which:

FIG. 1 is a block diagram of a known frequency separating tree system;

FIG. 2 schematically illustrates known frequency band splitting;

Figure 9:
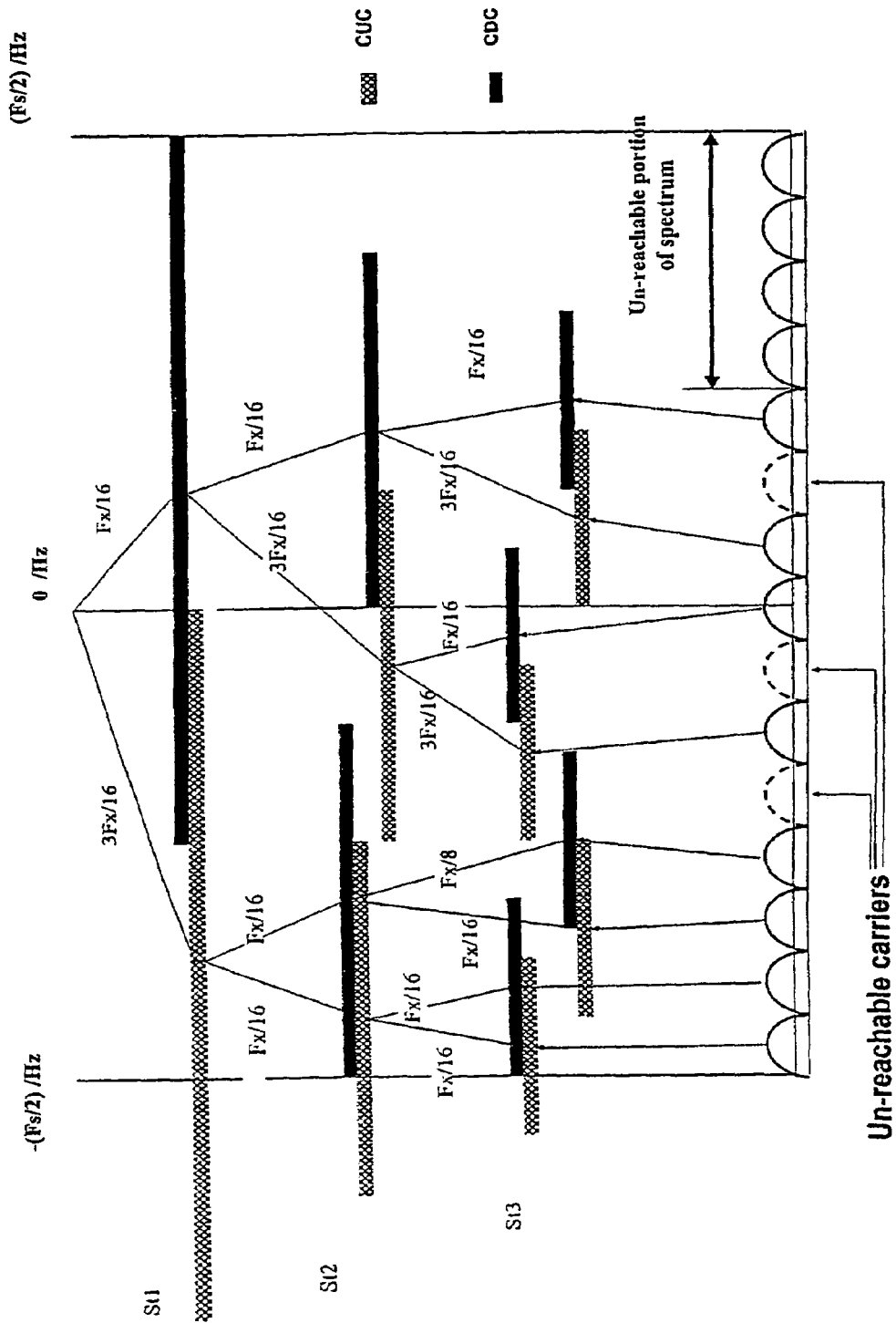
Figure 10:
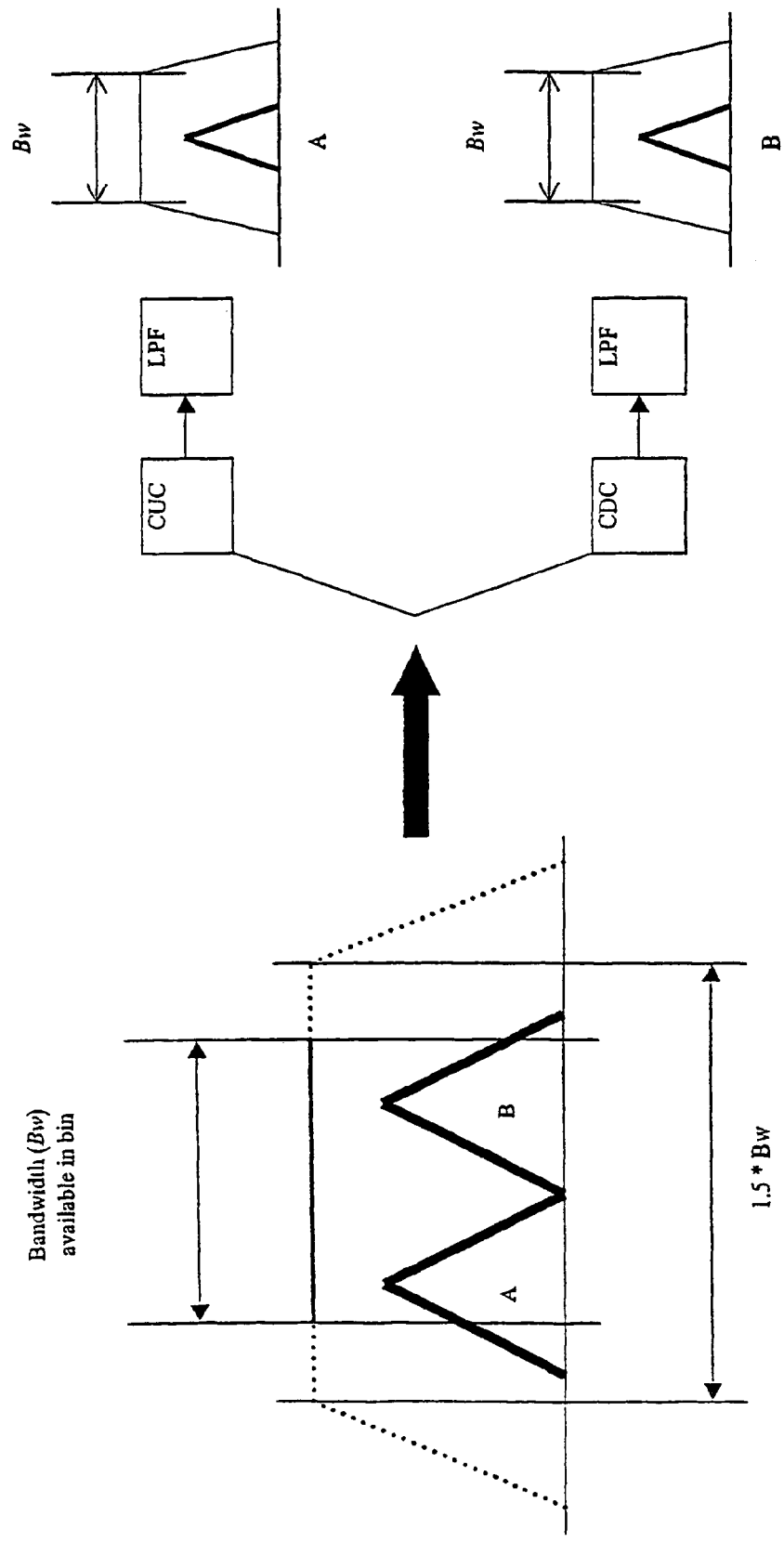
Figure 11:
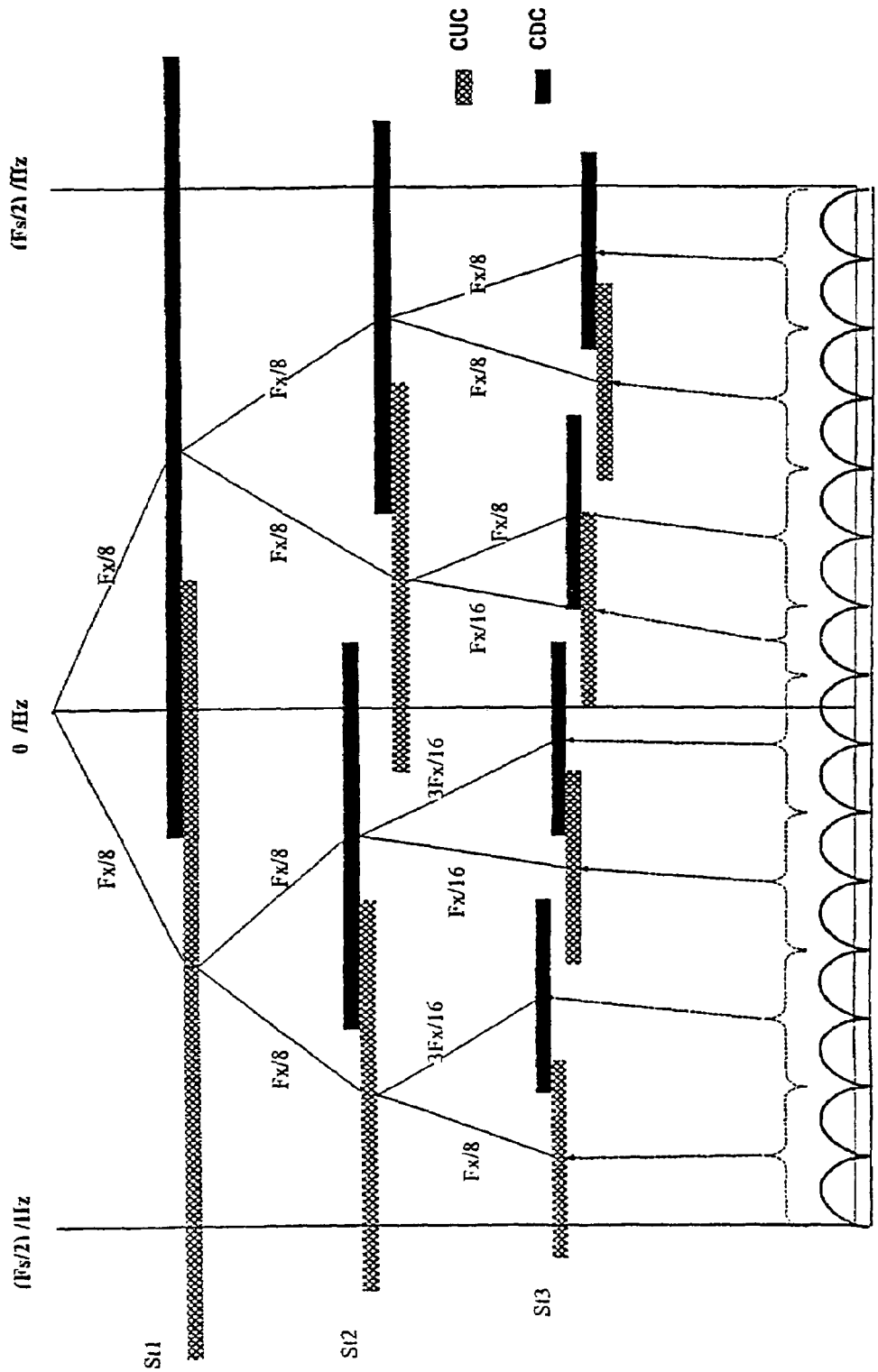
Figure 12:
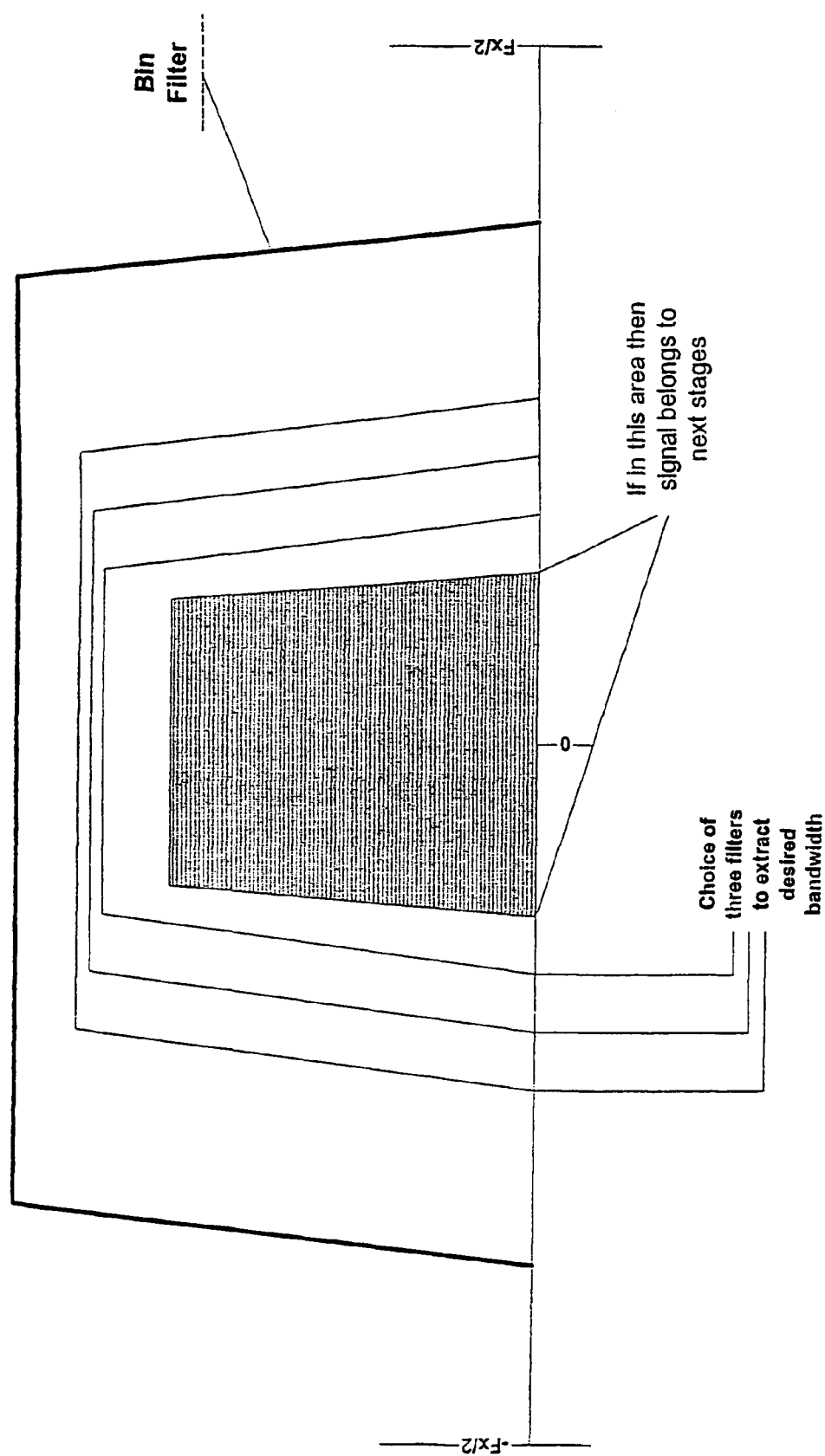
Figure 13:
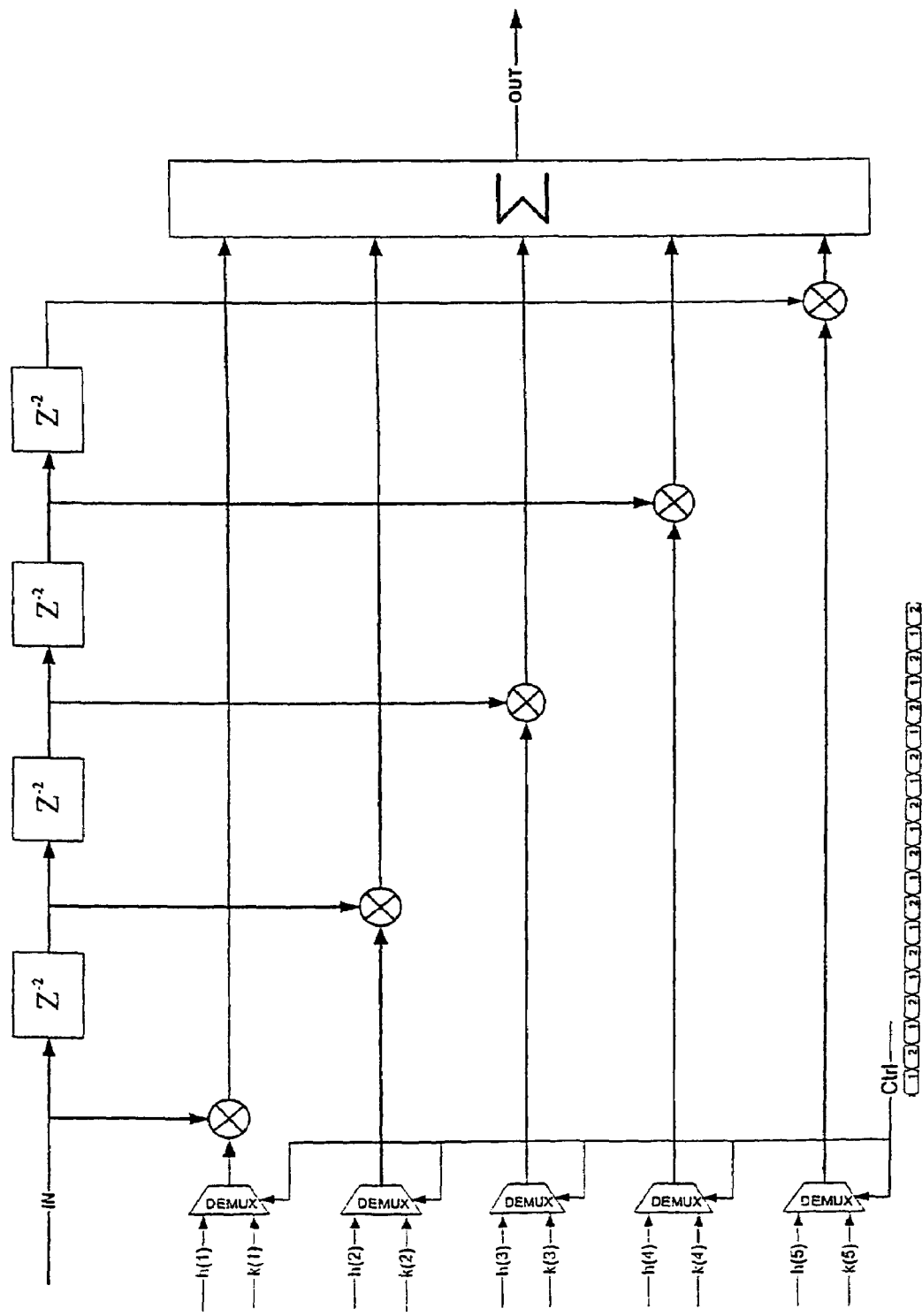
Figure 14:
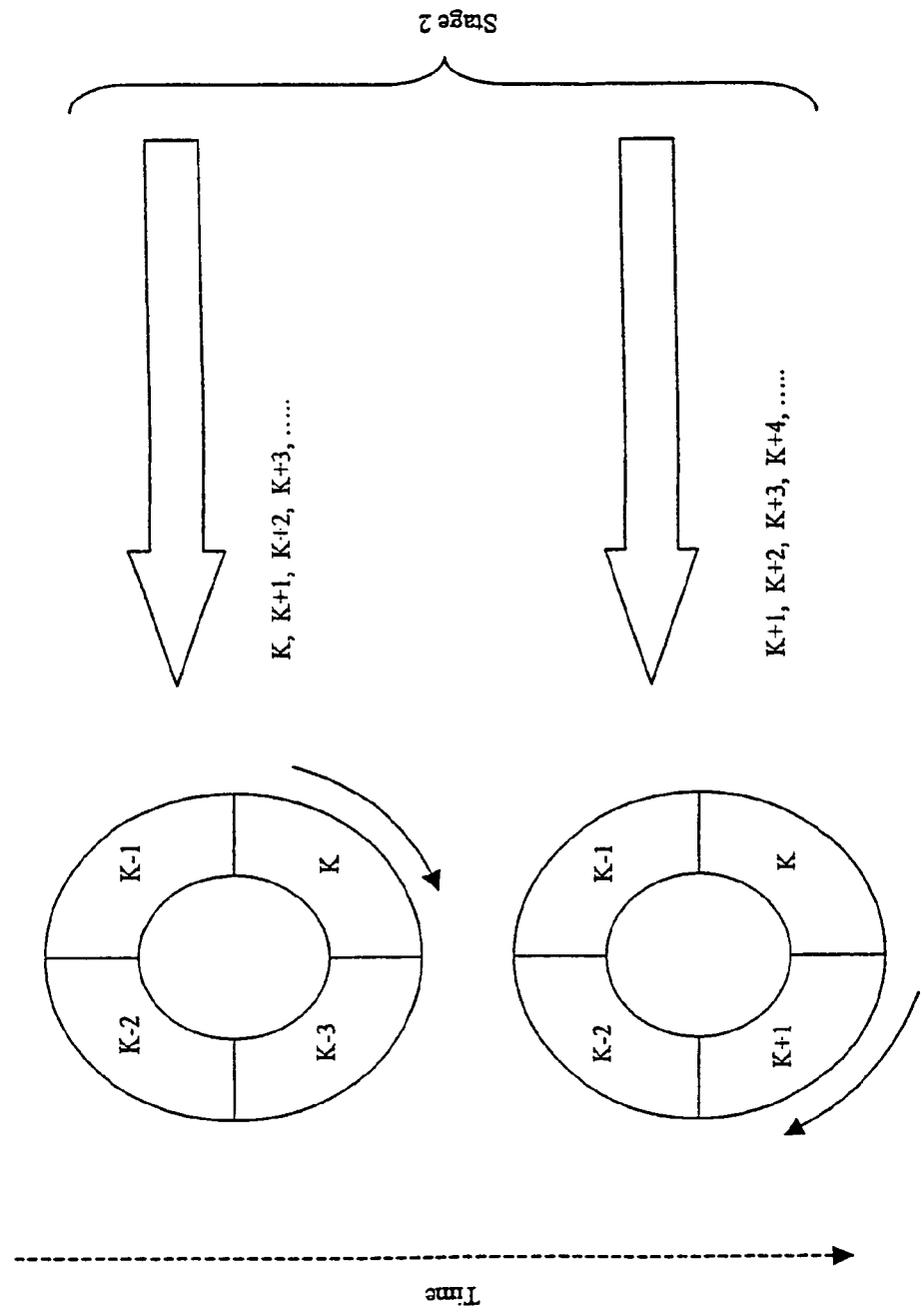
Figure 15:
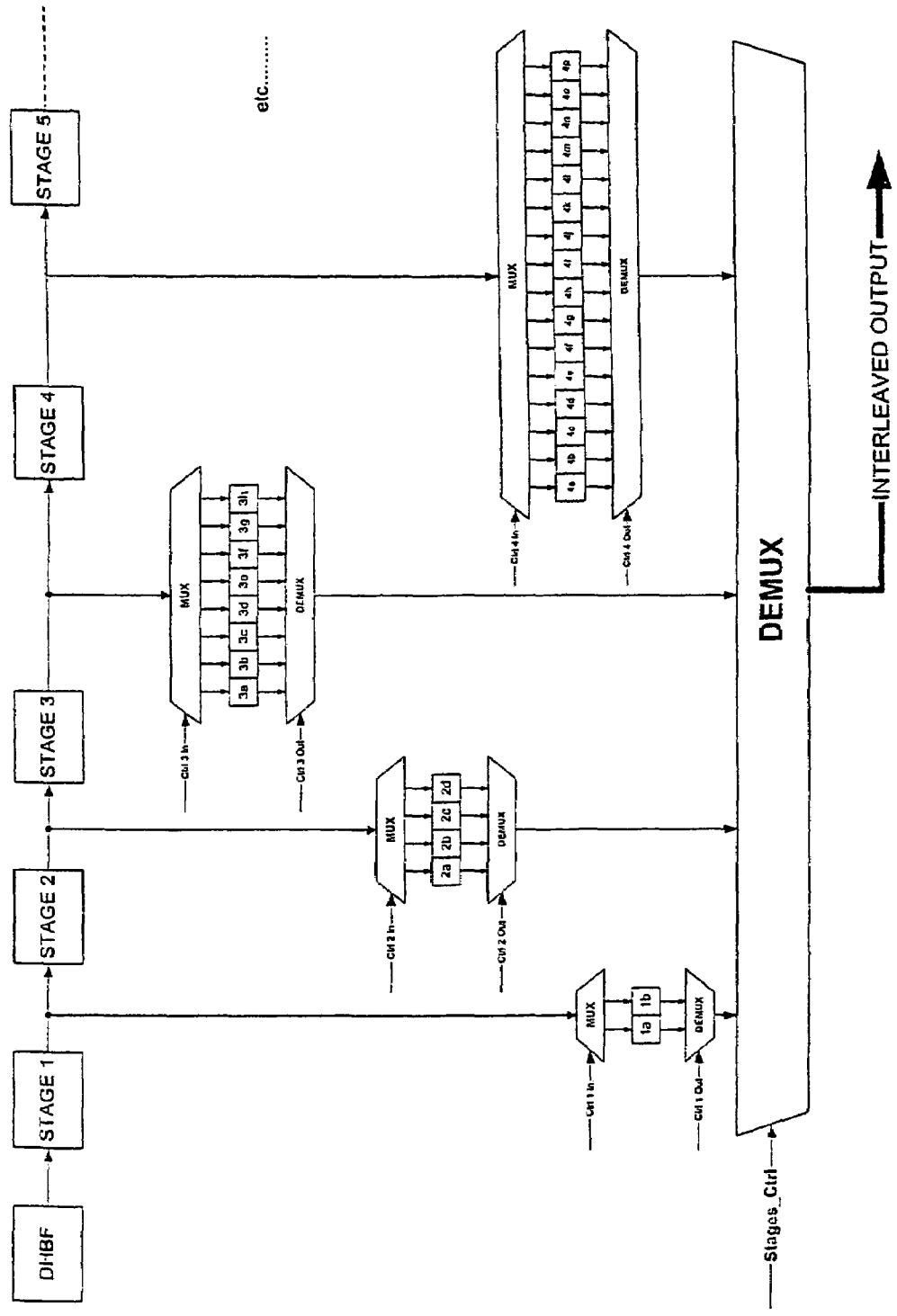
Figure 16:
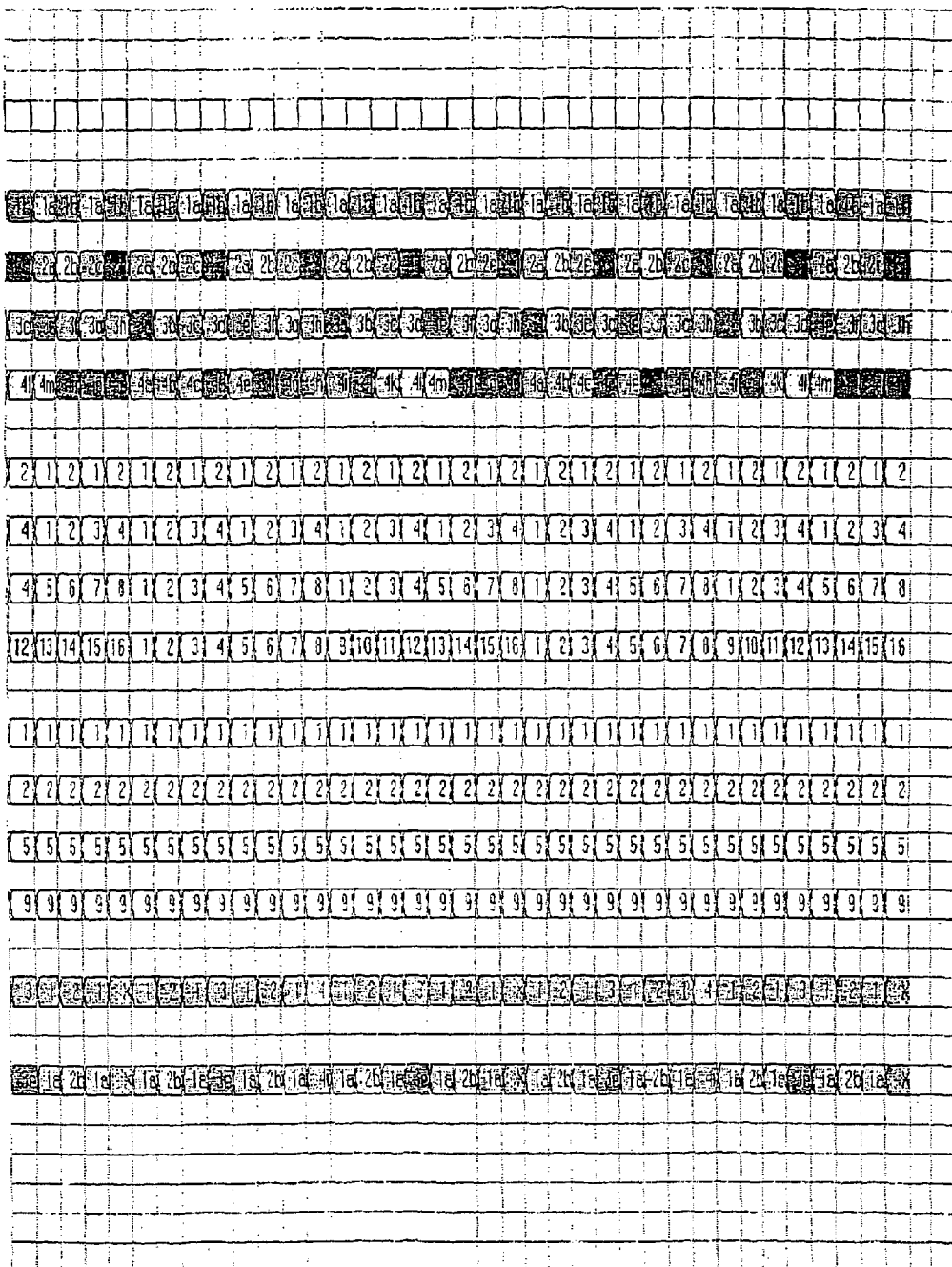
Figure 17:
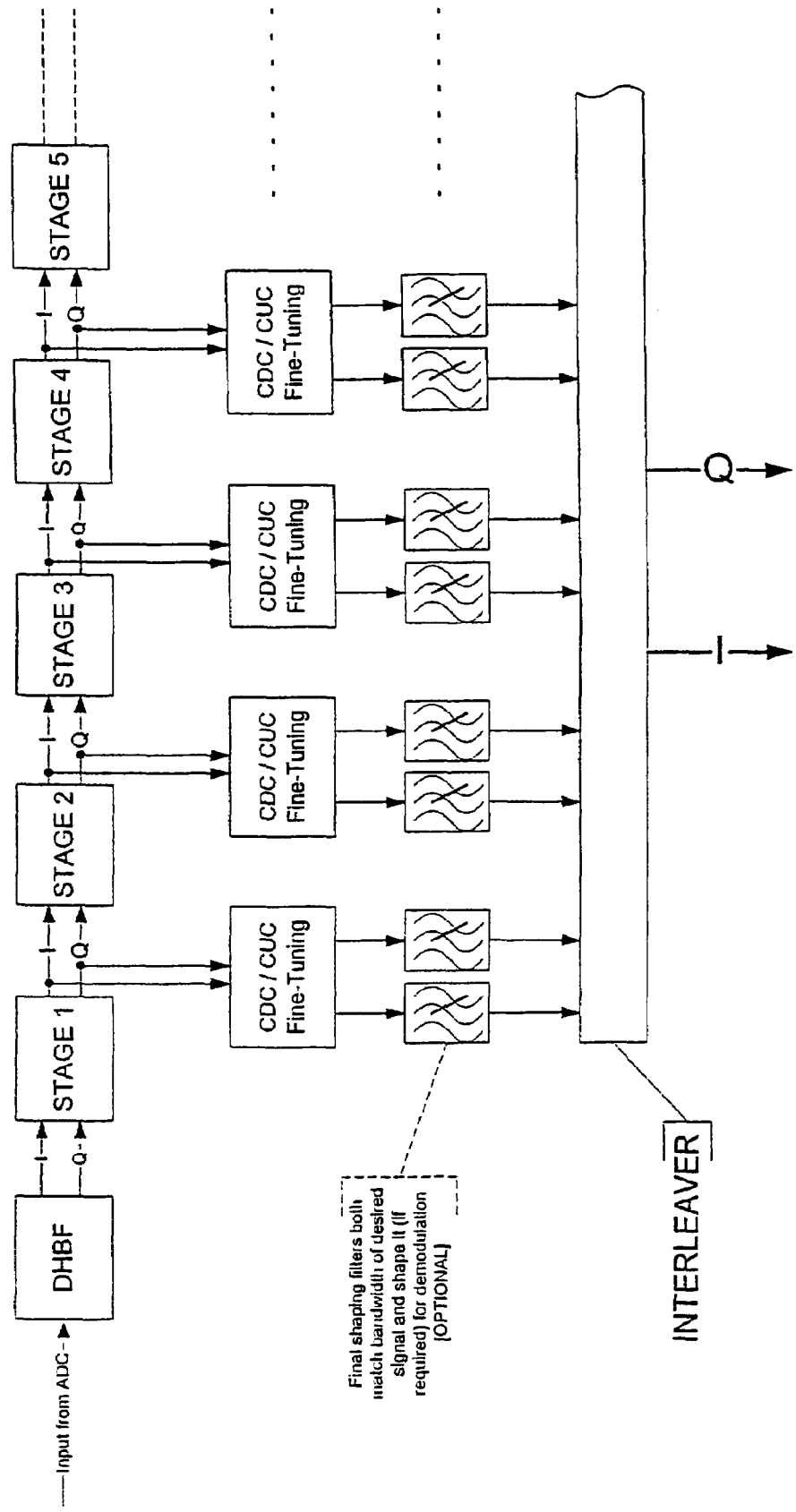
Figure 18:
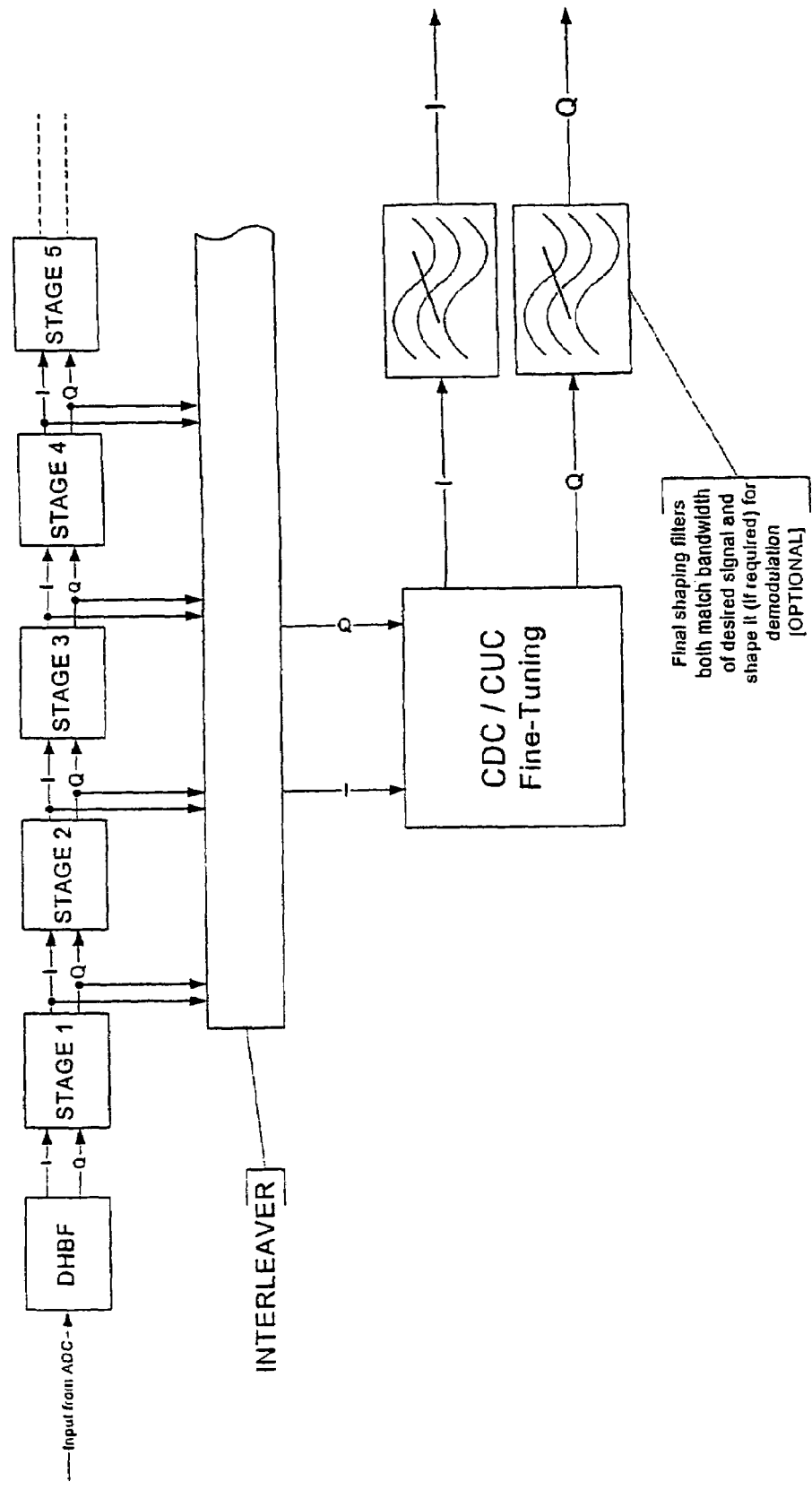
Figure 19:
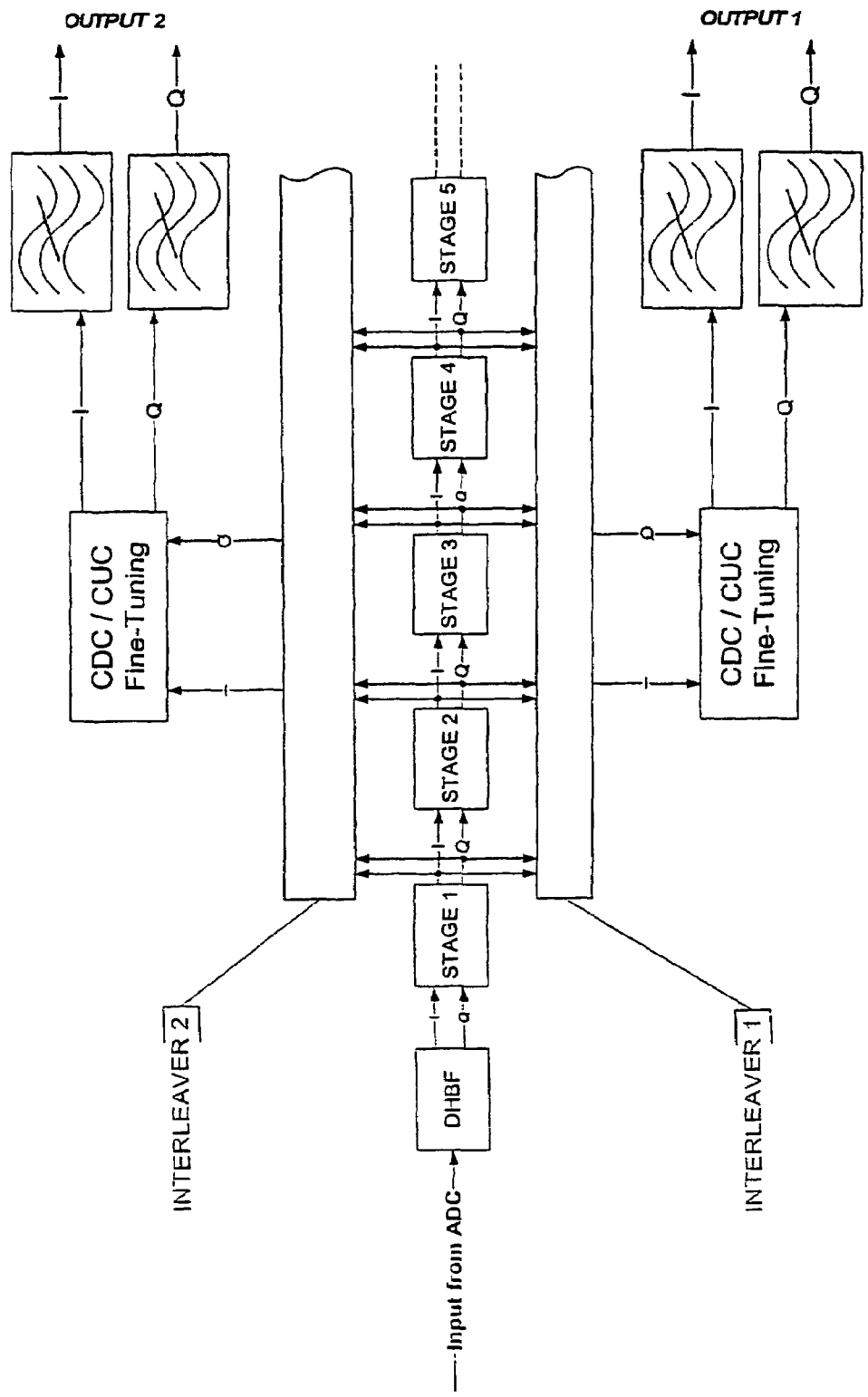
Figure 20:
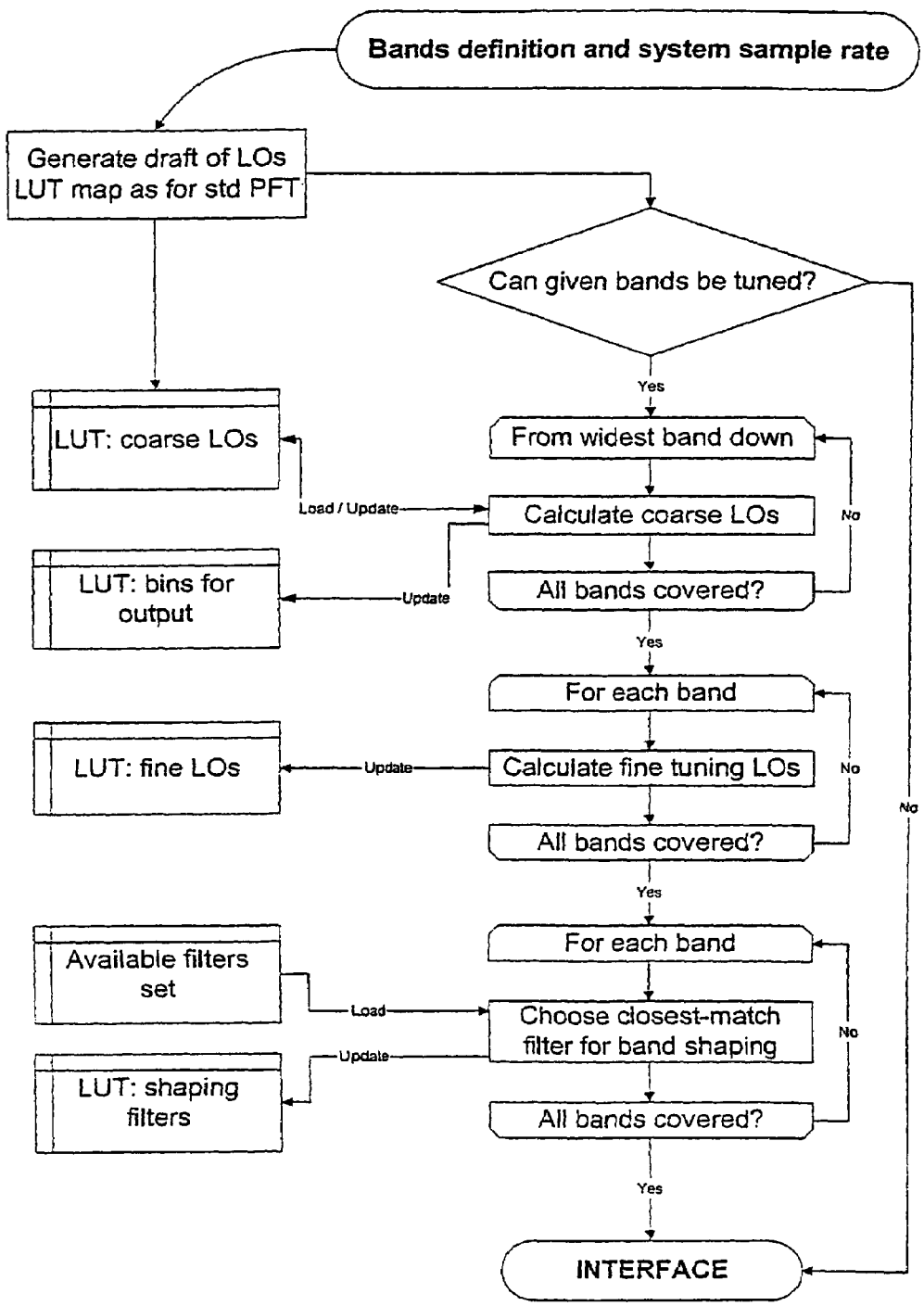
Figure 21:
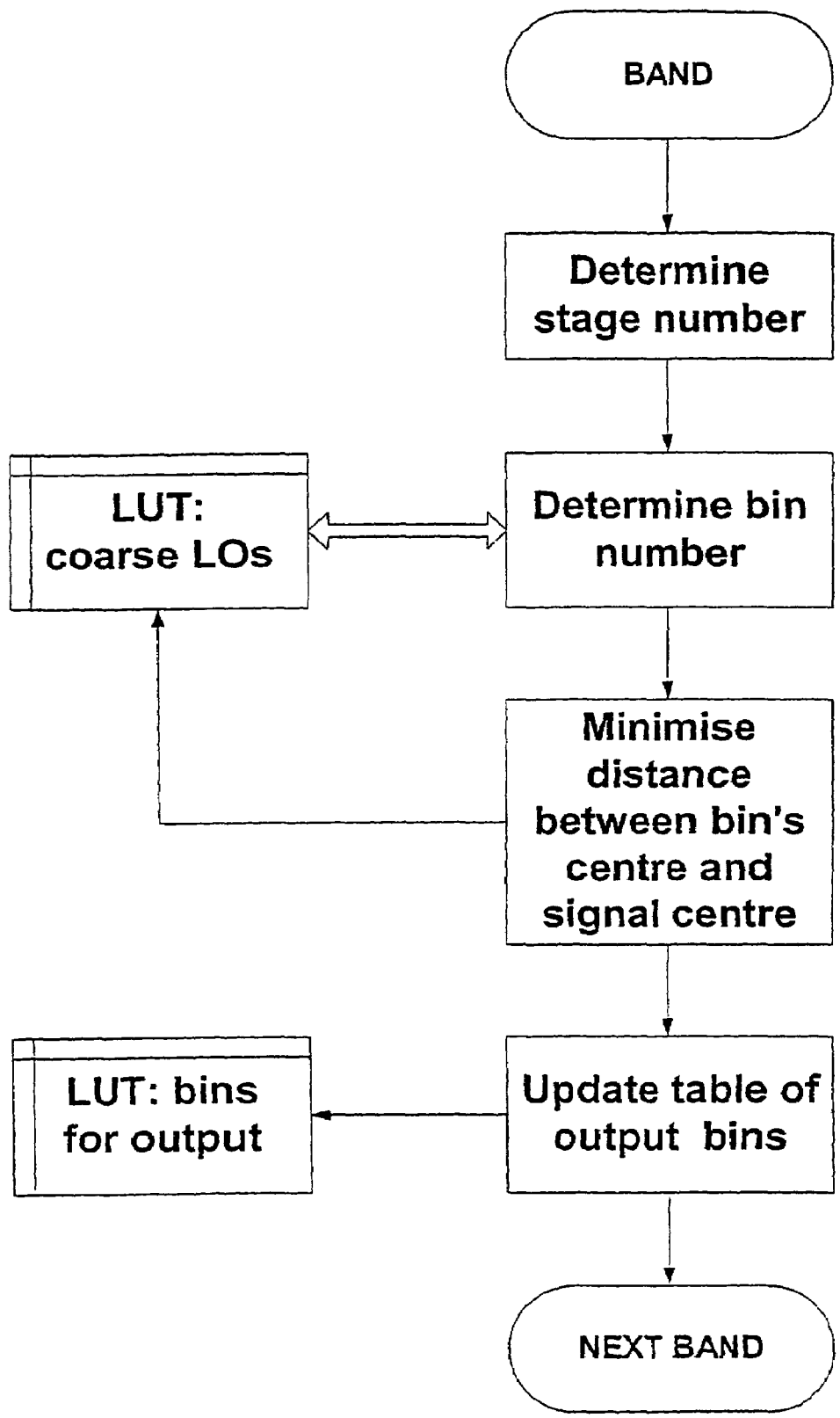
Figure 22:
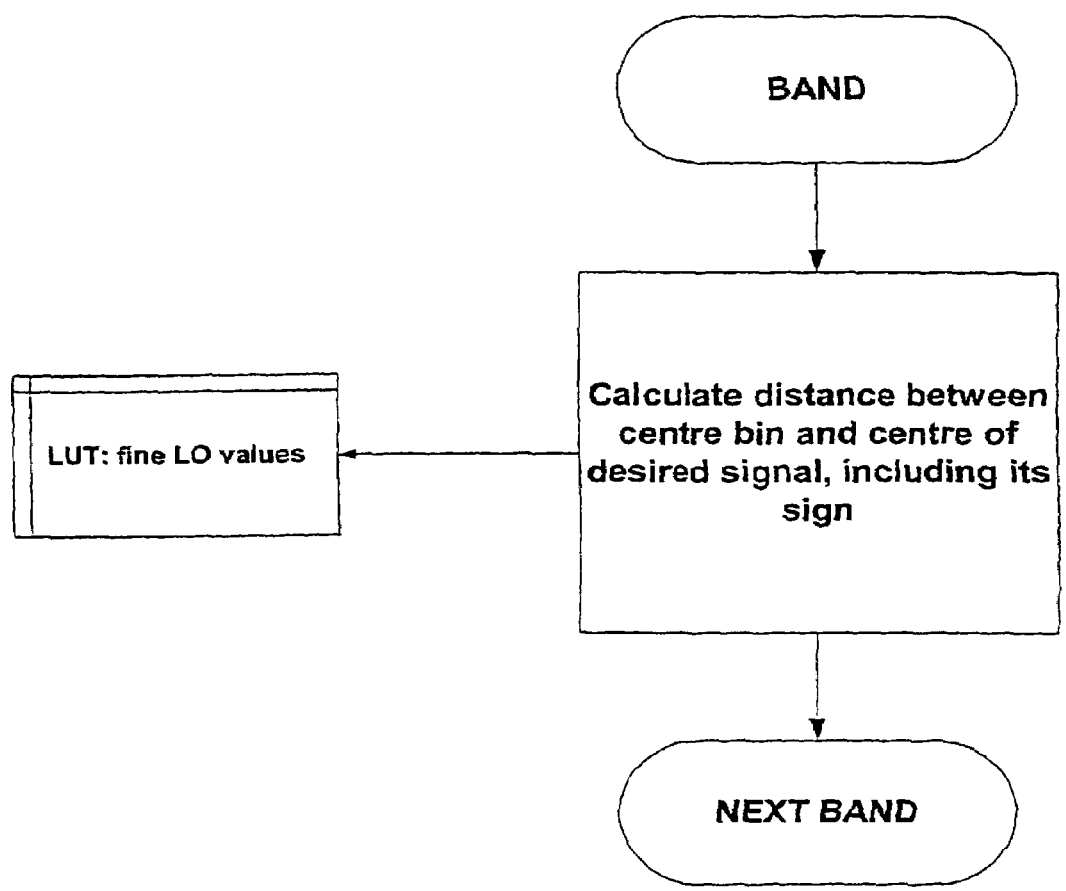

FIG. 9 schematically illustrates example limitations that can arise due to extracting only one signal per filter;

FIG. 10 schematically illustrates two frequency components per filter extraction;

FIG. 11 illustrates an example of extracting two signals per filter with the result that all required frequencies can be extracted;

FIG. 12 schematically illustrates shaping filter selection;

FIG. 13 illustrates an example of a 5-tap poly-phase band-limiting/shaping filter for use in stage 1 with intermediate outputs;

FIG. 14 illustrates an example of sample buffering in intermediate stages;

FIG. 15 illustrates an example of an implementation of an output interleaver;

FIG. 16 illustrates an example of a control line timing diagram for the output interleaver in FIG. 15;

FIG. 17 schematically illustrates a tuneable pipelined frequency transform architecture with output interleaver positioned after fine-tuning components;

FIG. 18 illustrates a tuneable pipelined frequency transform architecture with output interleaver position before fine-tuning components;

FIG. 19 is a block diagram of a full tuneable pipelined frequency transform architecture having two interleavers to allow the extraction of multiple target carrier signals from a single bin;

FIG. 20 is a flow diagram illustrating an algorithm for determining lookup table and other parameters for the tuneable pipelined frequency transforming system;

FIG. 21 is a flow diagram illustrating the coarse tuning routing sub-system;

FIG. 22 is a flow diagram illustrating the fine-tuning routing sub-system; and

Figure 23:
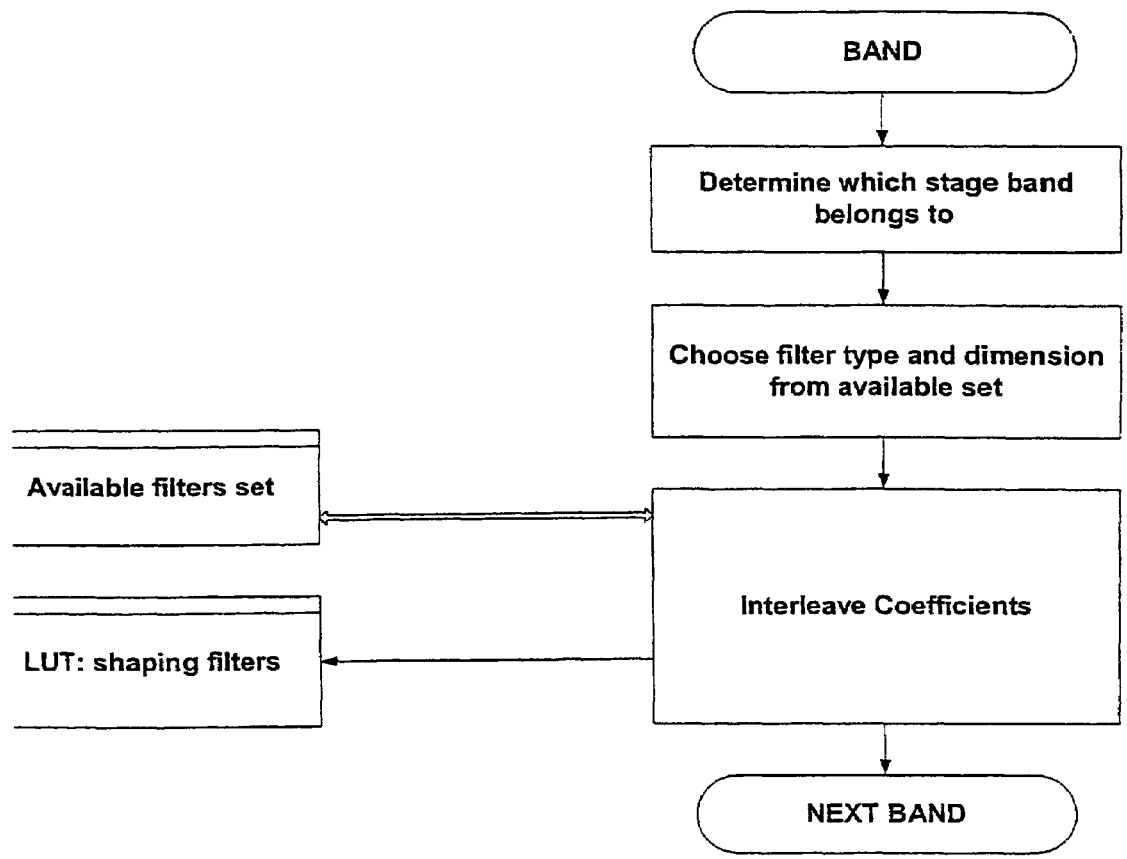

FIG. 23 is a flow diagram illustrating the band-limiting/shaping filter selection.

The most common frequency analysis method used in Digital Signal Processing (DSP) is the Discrete Fourier Transform (DFT) or its widely-used variant, the Fast Fourier Transform (FFT). These techniques have embodiments in both software algorithms and hardware form.

A technique has been developed as described in International Published Patent Application No. WO-A-01/65692 which uses a very different approach (referred to as PFT). In its simplest form, it may be realised as a "tree" system by successively splitting the frequency band of interest into two separate contiguous bands, each one being centred on zero frequency (zero IF). This is achieved by using complex up and down-converters. In order to provide a useful number of bands, a large number of complex converters is required (e.g. for 1024 bands, this would need 2047 converters).

There is an alternative method, however, which allows exactly the same result to be achieved with far fewer converters. This involves interleaving the samples from the two bands at each stage and passing them through a modified form of up-/down-converter. This requires only $1+2*\text{Log}_2$ (N) stages where N is the final number of frequency bands. For example, 1024 bands would now require only 11 converters, compared with the 2047 mentioned above for the "tree" system. The method is now very practicable and has a similar economy of scale as the FFT has over the more direct DFT (Discrete Fourier Transform) methods.

Figure 1:
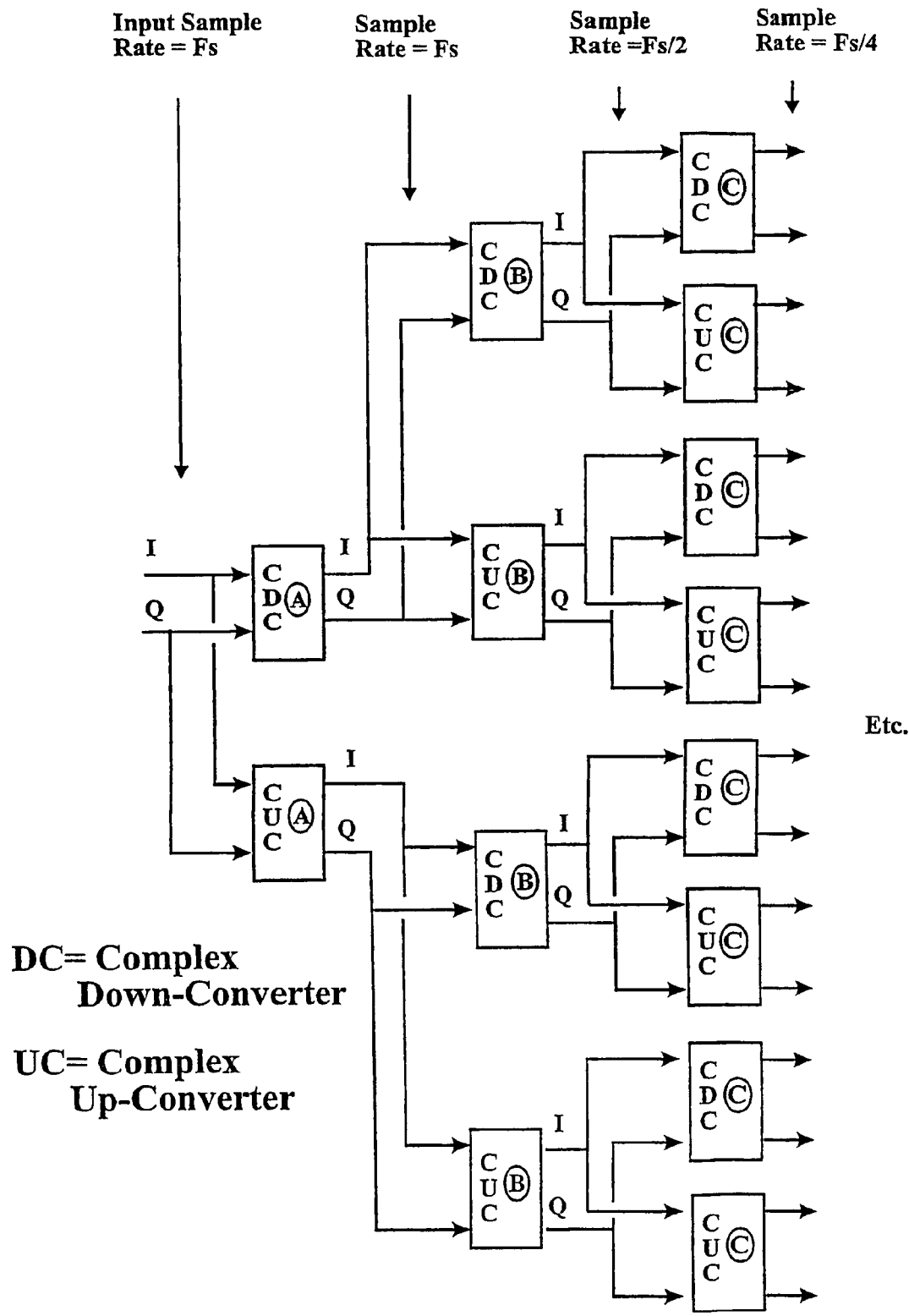
Figure 2:
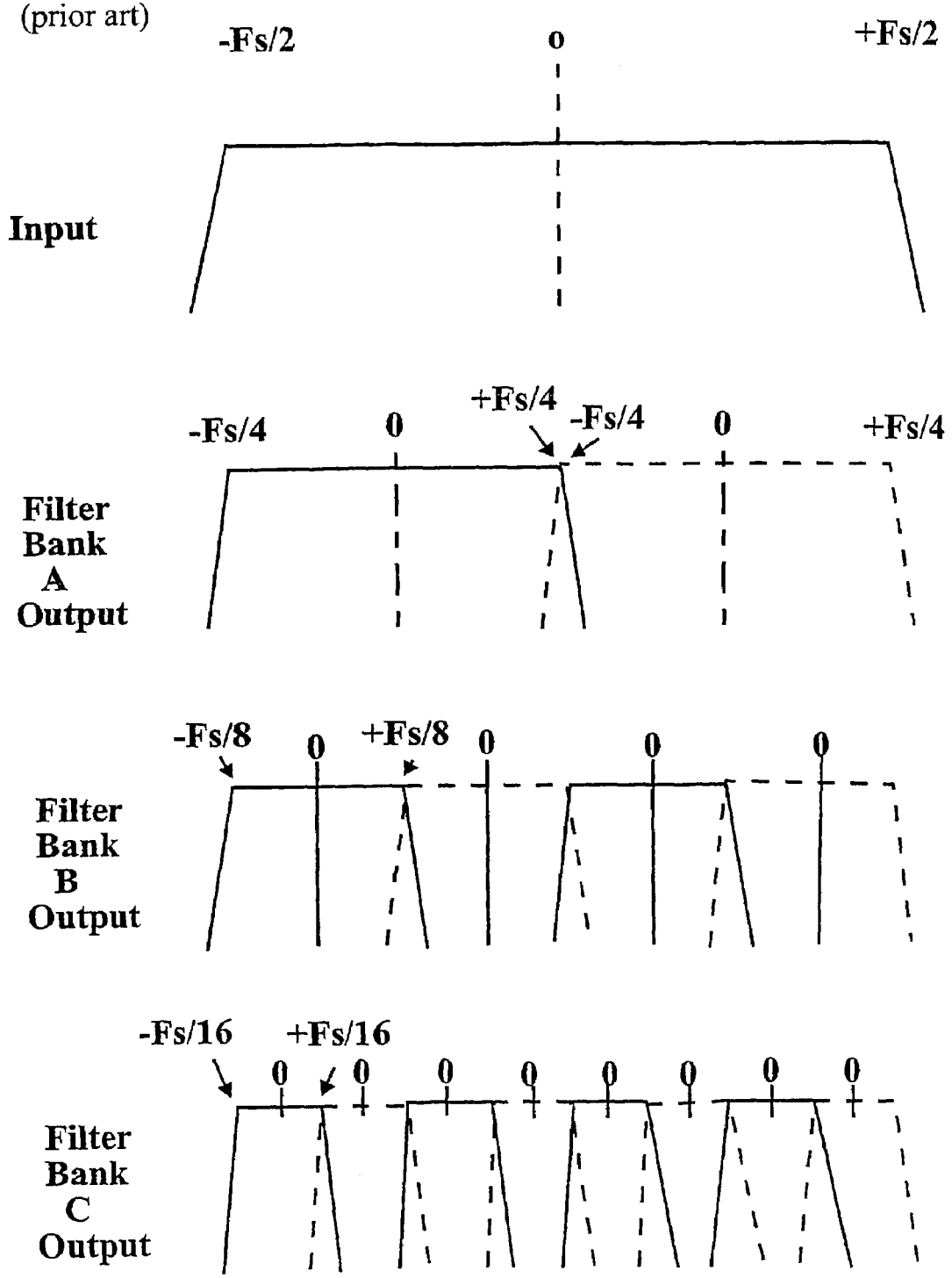

FIG. 1 gives a simplified block diagram of a 3-stage tree system. The input to the system is a band-limited signal, centred on zero frequency (or zero IF). The sample rate is $F_s$ and, by using a complex (I&Q) form, the input band can occupy from $-F_s/2$ to $+F_s/2$, as illustrated in FIG. 2. The input is now split into two bands by using a Complex Down-Converter (CDC) and a Complex Up-Converter (CUC). Thus, in FIG. 2, the upper half of the input band (i.e. 0 to $+F_s/2$) is down-converted to the band $-F_s/4$ to $+F_s/4$. Similarly, the lower half of the input band is up-converted to the band $-F_s/4$ to $+F_s/4$.

Figure 3:
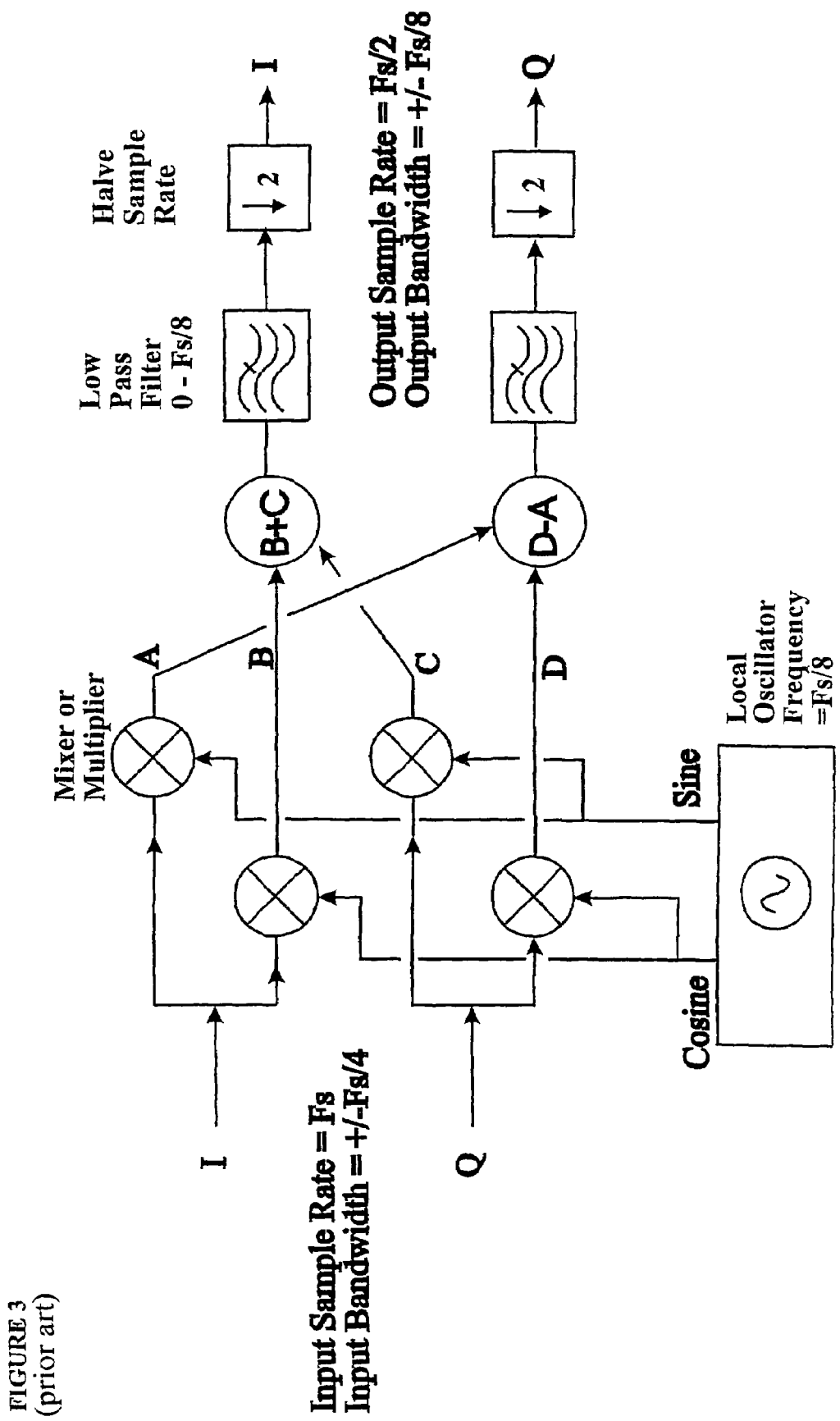
FIG. 3 is a block diagram of a known complex down-converter (CDC)
Figure 4:
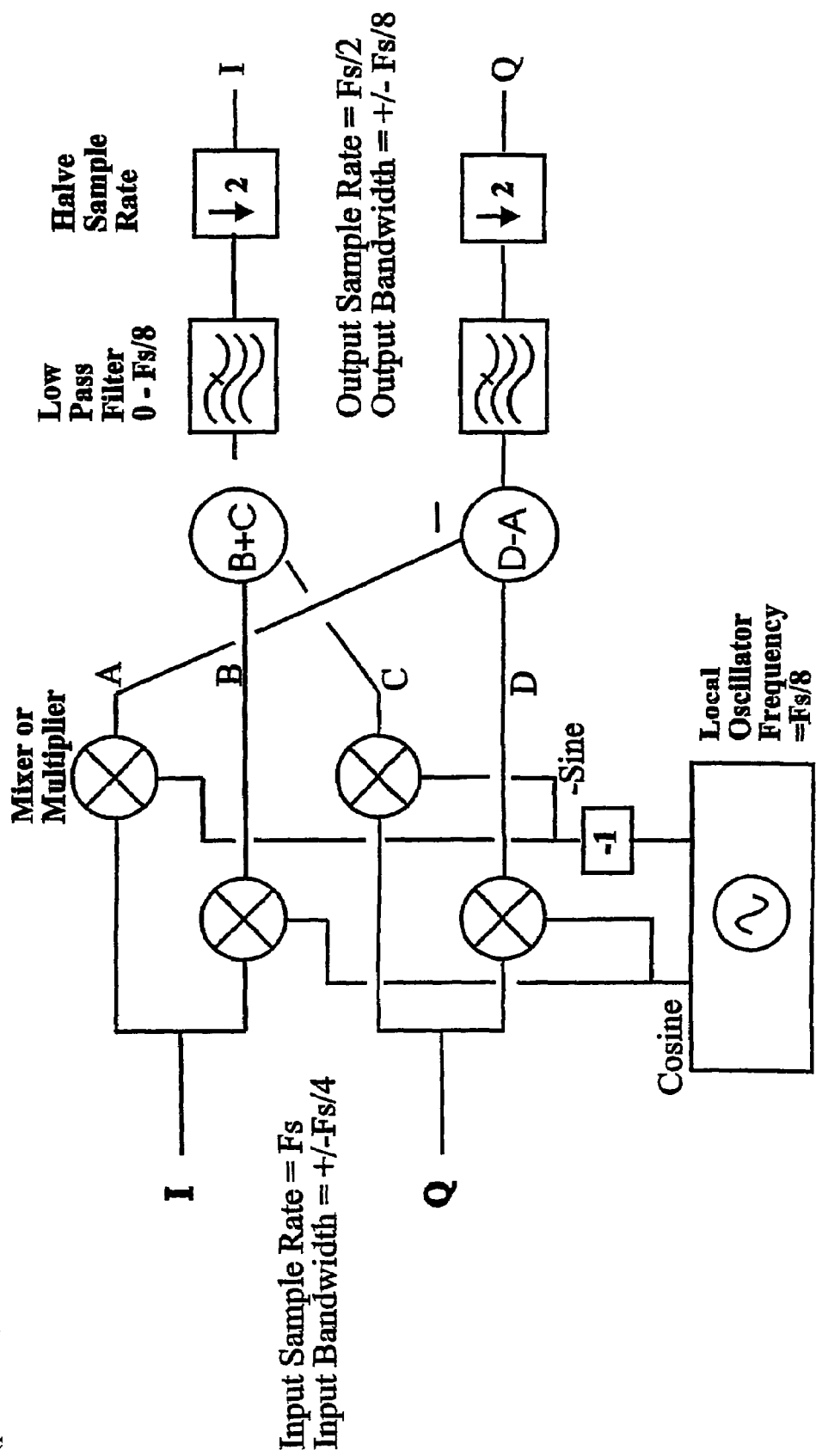
FIG. 4 is a block diagram of a known complex up-converter (CUC)

The realisation of the complex down-converter (CDC) is shown in FIG. 3 and the complex up-converter (CUC) in FIG. 4. These are intended to show the principle of operation only. The actual realisation can be much simplified since the Sine and Cosine need only take one of five values $$\left(0, +1, -1, +\frac{\sqrt{2}}{2} \text{ and } -\frac{\sqrt{2}}{2}\right).$$

Figure 5:
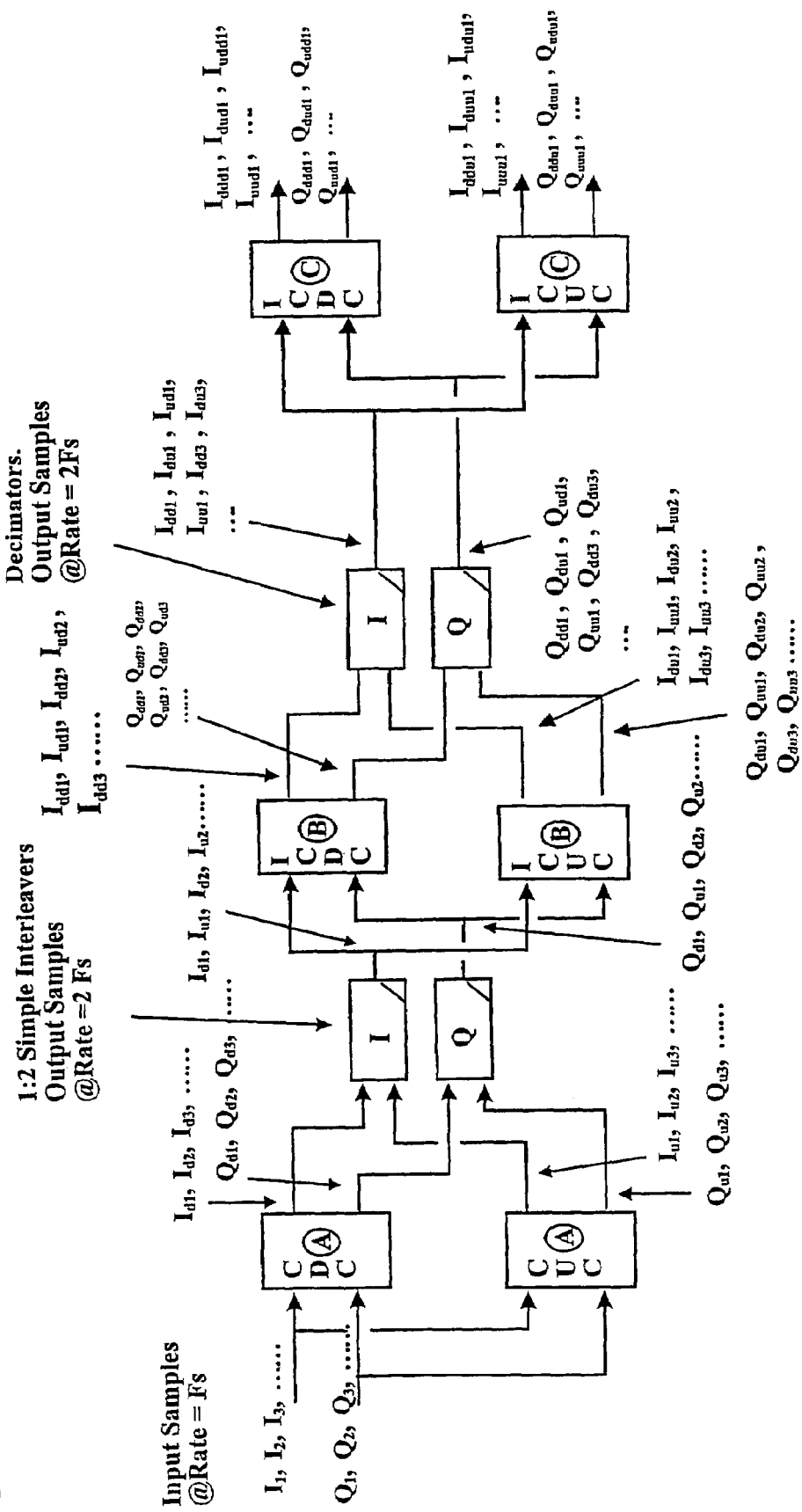
FIG. 5 is a block diagram of known interleaving structure.

The overall block diagram is shown in FIG. 5. The first pair of converters (CDC 'A' and CUC 'A') are identical with those of the "tree" system (FIG. 1).

Thereafter, however, the samples for the 'I' channel and for the 'Q' channel are interleaved before passing to the next stage of processing.

The Interleaved Complex Down-Converter (ICDC) differs from the CDC of the "tree" system in that the Low Pass Filters are now of a special form, typically known as "Interpolating FIR Filters". By adding additional delay between the taps of a FIR (Finite Impulse Response) filter, it is possible to process any number of independent data streams by first interleaving them. The filtered output data is also interleaved in the same manner.

The requirements are that each of the independent data streams needs to be processed by an identical filter and that the Interpolating FIR filter is capable of running at the increased sample rate caused by interleaving the input data. Since each of the CDC's of the "Tree" system in any one filter bank are identical, the first requirement is met. Also, although the number of independent sample streams increases by a factor of two at each branch of the tree, the sample rate also drops by a factor of two. Thus it is possible to interleave the samples without any overall increase in sample rate, thus satisfying the second requirement above.

Exactly the same arguments apply to the Interleaved Complex Up-Converter (ICUC). The final output of the interleaved system is identical with that of the "Tree" system except that, of course, the "Tree" system outputs are in parallel form whereas the "Interleaved" system outputs are in serial form.

The interleaving and decimation process is not completely straightforward and needs some explanation. Referring to FIG. 5, the complex stream of input samples to CDC(A) and CUC(A) are designated $I_1, I_2, I_3, \ldots$ etc. and $Q_1, Q_2, Q_3, \ldots$ etc. at a sample rate of $F_s$. The output of the Complex Down-Converter (CDC(A)) is the filtered sample stream, designated $I_{d1}, I_{d2}, I_{d3}, \ldots$ etc. and $Q_{d1}, Q_{d2}, Q_{d3}, \ldots$ etc. and the corresponding output from the Complex Up-Converter (CUC (A)) is the filtered sample stream, designated $I_{u1}, I_{u2}, I_{u3}, \ldots$ etc. and $Q_{u1}, Q_{u2}, Q_{u3}, \ldots$ etc. These output sample streams are also at a sample rate of $F_s$.

A pair of simple interleavers then follow which interleave the I samples, giving the stream $I_{d1}, I_{u1}, I_{d2}, I_{u2}, I_{d3}, I_{u3} \ldots$ etc. and also the Q samples giving the stream $Q_{d1}, Q_{u1}, Q_{d2}, Q_{u2}, Q_{d3}, Q_{u3}, \ldots$ etc. These are now at the increased sample rate of $2F_s$.

The interleaved I and Q sample streams are then processed by the Interleaved Complex Up and Down-Converters (ICDC (B) and ICUC(B)). The complex output data stream from ICDC(B) is designated $I_{dd1}, I_{ud1}, I_{dd2}, I_{ud2}, I_{dd3}, I_{ud3}, \ldots$ Etc. and $Q_{dd1}, Q_{ud2}, Q_{dd2}, Q_{ud2}, Q_{dd3}, Q_{ud3}, \ldots$ Etc. The complex output data stream from ICUC(B) is designated $I_{du1}, I_{uu1}, I_{du2}, I_{uu2}, I_{du3}, I_{uu3}, \ldots$ Etc. and $Q_{du1}, Q_{uu1}, Q_{du2}, Q_{uu2}, Q_{du3}, Q_{uu3}, \ldots$ Etc. The sample rate at this point is still $2F_s$ which is twice the necessary rate. It is not possible, however, to simply decimate the samples by a factor of two (i.e. to remove every other sample) because of the interleaved nature of the samples. Instead, it is necessary to accept the first and second sample of each stream, remove the third and fourth, accept the fifth and sixth sample and so on before interleaving. This yields sample streams at the output of the 2:4 Complex Interleaver/Decimator as follows:—

$I_{dd1}, I_{du1}, I_{ud1}, I_{uu1}, I_{dd3}, I_{du3}, \ldots$ Etc. and $Q_{dd1}, Q_{du1}, Q_{ud1}, Q_{uu1}, Q_{dd3}, Q_{du3}, \ldots$ Etc.

For any subsequent stages, the interleaver/decimator principle is the same. For example, the following stage would retain samples 1, 2, 3 and 4, discard samples 5, 6, 7 and 8, remove samples 9, 10, 11 and 12 (etc.) before interleaving. The next stage would retain samples 1 through 8, discard samples 9 through 16 and so on. The implementation of this process can be carried out in various ways including, for example, switched FIFO (first in first out) memory with the read rate set to half the write rate.

As previously mentioned, in certain applications, frequency spans of various sizes need be separated and/or extracted for further processing, but such process cannot be performed by any of the frequency splitting techniques mentioned before. The modular pipelined architecture employed for the PFT serves itself well for the purpose of extracting different size frequency bands: at each stage the spectrum is separated into bands which are half as wide as those from the previous stage, as illustrated in FIG. 2.

Due to the PFT cascaded structure (FIG. 5), intermediate outputs are readily available thus different size frequency bands can be extracted for output. However, such a scheme still presents the limitation of providing bands which are both only a power of two fraction of the spectrum of interest and can only be centred as shown in FIG. 2.

It is possible, by means of modifying the PFT architecture, not only to extract a frequency band of the desired size, but also to ensure said band is centred at any given frequency.

Figure 6A:
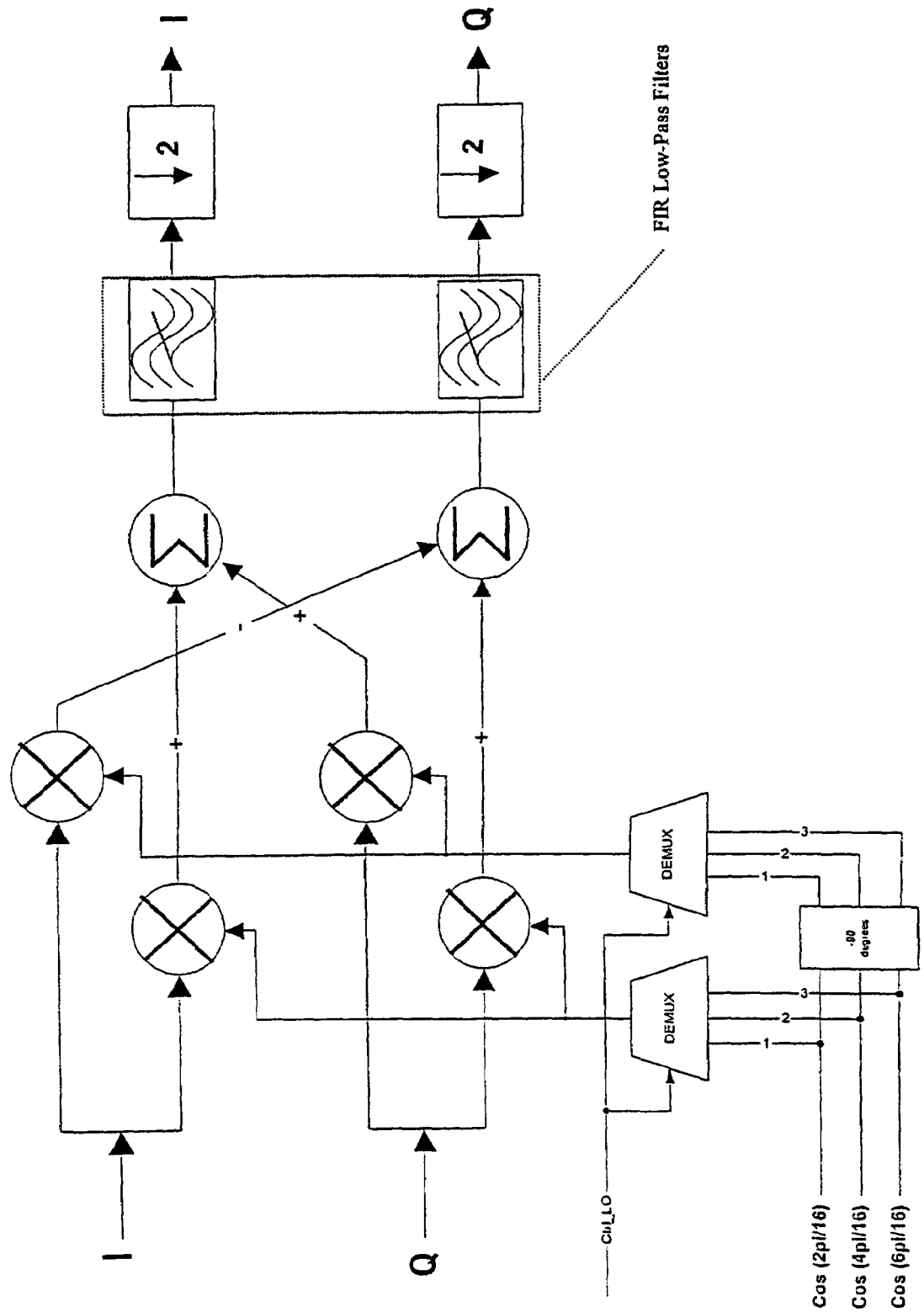
FIG. 6A is a block diagram of a complex down-converter for a tuneable pipelined frequency transform.
Figure 6B:
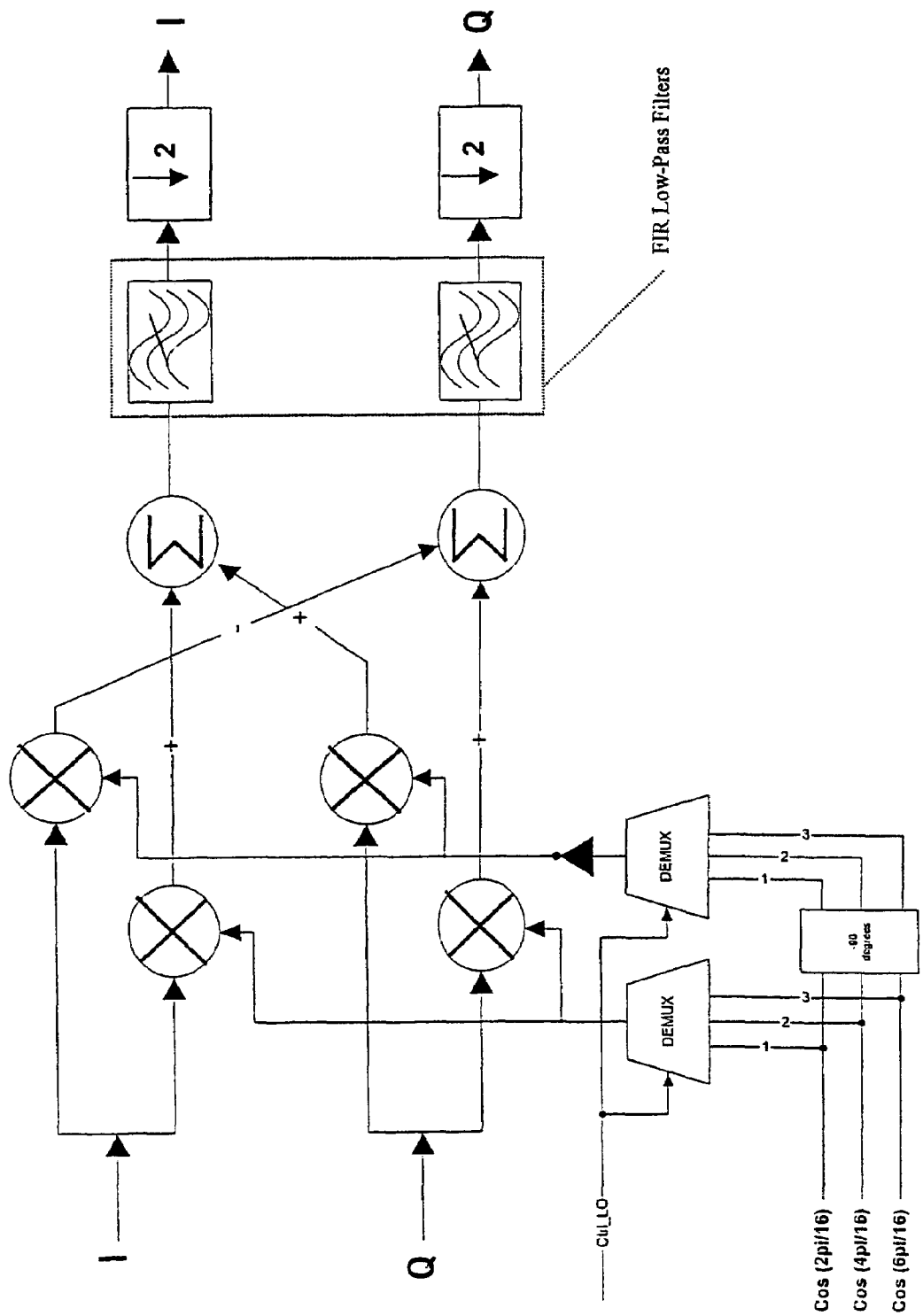
FIG. 6B is a block diagram of a complex up-converter for a tuneable pipelined frequency transform.
Figure 7:
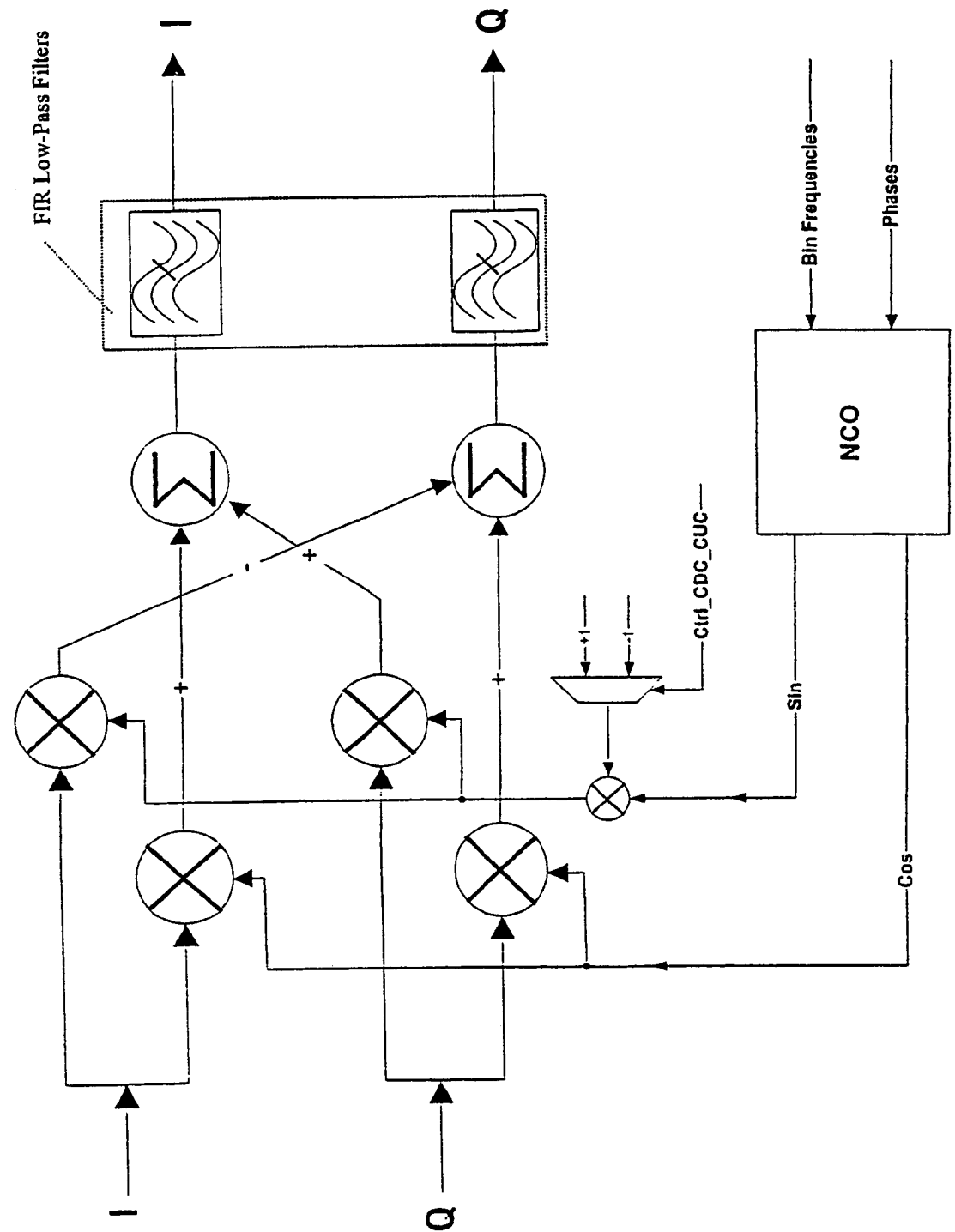
FIG. 7 is a block diagram of a fine-tuning complex converter.

The level of tuneability referred to above is achieved in two stages: firstly the signals are coarsely tuned within the PFT stages, then fine tuned by a complex converter whose Local Oscillator (LO) is a Numerically Controlled Oscillator (NCO) controlled by the routing engine (a schematic of these subsystems is shown in FIGS. 6A, 6B and 7).

The main advantage of performing the tuning operation in two steps is the reduction of the size, for a given frequency resolution, of the Look-Up Table (LUT) used for fine-tuning: the fine-tuning mixing process only needs to shift frequencies by a maximum of $Fs_{bin}/16$ Hz instead of the full $Fs_{bin}/4$. This in practice translates to a fourfold LUT size saving for a given frequency resolution. It should be noted that the frequency resolution is relative to the stage considered and is given by: $Fx_{resolution} = (Fx/16)/LUT_{size}$, where Fx is the sample rate of every bin out of stage x.

After fine-tuning takes place, a polyphase Finite Impulse Response (FIR) filter is used to extract only the required bandwidth for each signal (FIG. 13). This filtering stage can also be used for spectral shaping/masking.

A polyphase filter is a filter whose tap coefficients are interleaved in time, i.e. they change for every sample phase. Such structure is very useful for filtering interleaved data streams.

Two variations of this architecture are possible: one places the output interleaver element after the shaping filters (FIG. 17). The other shows a more compact implementation where the fine-tuning and filtering elements are placed after the output interleaver and operate on the interleaved output stream (FIG. 18). The output-interleaver is described in detail below.

As already mentioned, in order to allow for flexible coverage of the spectrum, extracting carriers from within intermediate stages must be allowed. Also, the frequency of the Local Oscillators (LOs) within the complex up-/down-converters needs to be controlled, and wider filters must be used to ensure that all possible frequencies within the spectrum are encompassed.

The approach chosen is to provide coarse tuning within the PFT stages, doing so by means of LOs values chosen from the following set $$\left\{ \frac{Fx}{16}; \frac{Fx}{8}; \frac{3Fx}{16} \right\},$$

where $$Fx = \frac{SampleRate}{2^{(stage\_number)}}, \text{ i.e. the band rate.}$$

Other sets of LOs values can also be chosen, though the choice adopted here seem to be the best compromise between hardware complexity and ensuring full spectrum coverage.

Figure 8:
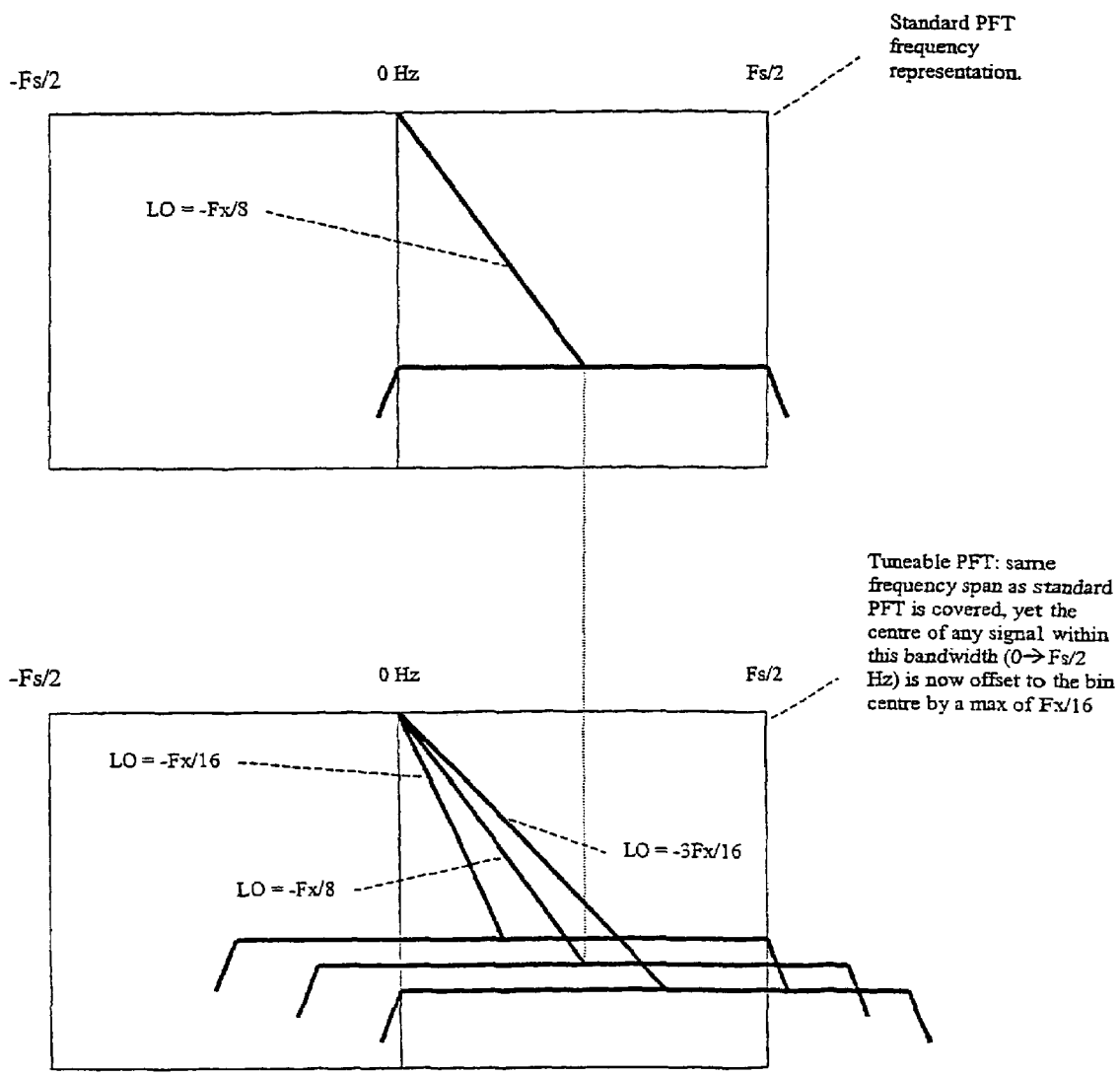
FIG. 8 illustrates a coarse tuning example of a first frequency separating stage, comparing a complex down-converter of a symmetric form with a tuneable complex converter, with this example having Fx as Fs/2.

FIG. 8 illustrates this process by comparing a standard PFT stage 1 down-converter with the Tuneable PFT equivalent. It can be seen that the wider filter permits the inclusion of the same frequencies as the standard PFT with the added benefit of ensuring that the centre of any carrier within the bin will not be further than Fx/16 from the centre of the bin itself.

However, the above conditions are only necessary to guarantee full coverage of the given spectrum, but not sufficient. The example on FIG. 9 illustrates the effects of having to extract a series of adjacent carriers of width slightly greater than the filters in the following stage. The result is that a larger than the necessary bin bandwidth is used up to extract these carriers so that a large portion of the spectrum becomes unreachable.

To overcome this problem, the routing algorithm allows for two carriers to be extracted from one bin (FIG. 11). This also implies that the interleaver, fine-tuning complex converter and filter blocks are duplicated in hardware as illustrated in FIG. 19. Furthermore, the fine tuning complex converter now needs to cope with frequency shifts greater than Fx/16, thus for a given frequency resolution, a larger LUT needs to be employed.

Two adjacent, or nearly adjacent carriers of total bandwidth Bw (where $F_x<Bw<1.5*F_x$) are extracted from a given bin. The problem of using more bandwidth than the one normally available in one bin is overcome by fine-tuning both carriers separately (FIG. 10), thus resulting in two output streams both running at the bin sample rate. However, the likelihood of this situation happening is very low, as carriers are normally separated by guard bands.

Furthermore the first and last 10~15% of the spectrum are typically unusable: any anti-aliasing filter at the front-end of the PFT would need to have a zero transition band to make 100% of the spectrum usable, or, alternatively, for the given bandwidth, the sample rate would need to be increased by a factor of 120%.

The trade-off between hardware complexity and flexibility in terms of guaranteeing full spectrum coverage for any given set of signals is application dependent and needs to be assessed for specific applications.

Although it is possible to manually change the TPFT parameters to achieve tuneability onto a band, this process can be completely automated. An algorithm to perform automatic routing onto the carriers of interest is presented in the following sections. This is also shown in state-flow diagram form in FIG. 20. The parameters that such algorithm needs to evaluate are:
  i. One or two signals out of each filter?
  ii. Number of stages required to extract all bands of interest?
  iii. LO values for each bin in each stage CDC and CUC?
  iv. Fine-tuning LO values into fine tuning CUC/CDC components?
  v. Choice of filter set for each bin in order to both shape the required band spectrum and to cut-off unwanted frequencies?
i) As previously mentioned, the system sample rate might be insufficient to output all bands of interest, as more bandwidth than necessary might be used for each signal. The routing algorithm needs to know whether this is the case, as the same bands would then be extracted from different stages. As an example, for a system rate of 204.8e6 Hz, a band of width 15e6 Hz would typically be extracted from stage 2 (in this example, any band of width Bw, where 12.8e6 Hz<Bw≦25.6e6 Hz, would be extracted from stage 2). However, if two such bands need to be taken from within this filter, the band of width Bw will be extracted out of a stage 1 filter (refer to similar example in FIG. 13).

Every signal is associated with a bin from which it will be extracted. If two different signals are associated with the same bin, then the fine tuning elements need to be duplicated and the TPFT outputs two interleaved sample stream (FIG. 19).
ii) The number of stages required to include all bands of interest is readily found as it corresponds to the stage number from which the smallest bandwidth signal needs to be extracted.
iii) & iv) Now that the parameters in (i) and (ii) are available, together with the bands definition, the routing algorithm initiates by setting the local oscillators (LOs) values into the CDC/CUC of each stage (FIG. 21).

The routing is based on the successive adjustment of a map of the bins' centres. Firstly, a map of the bin centres frequency position is drawn as it would be for a standard PFT. This map is then updated for each band, starting from the widest through the smallest one.

A copy of the initial map is kept in order to determine whether LO values have already been changed. If this is the case, and another band requires LO values that have already been changed within a given stage to change, then the two adjacent bands are considered together and the target centre for the stage bin becomes the mid point between these two bands.

The latter situation relates to the possibility of having to extract two bands from within one filter. This effectively restarts the routing process forcing extraction of the two mentioned bands from one filter in the previous stage. The routing algorithm then continues until all bands are considered.

While the CDC and CUC LO values are set for coarse tuning, values for the fine-tuning LO within the CDC/CUC block on the output of the TPFT are also stored (FIG. 22).

All the LO values, both those for coarse tuning as well as those for fine tuning are interleaved such that each bin within every TPFT stage will be shifted in frequency by the necessary amount.
v) Finally, an optional feature of the TPFT: fine shaping filtering. It is possible to further filter each band out of the TPFT to ensure that only the desired frequency span is extracted. The filter shape and size are chosen according to the type of signal received (user defined) and the relative frequency occupancy of the band within the bin it is extracted from.

The implementation chosen here is to allow for a set of n filters, where n is an arbitrary value chosen to determine the accuracy by which the filters match the signal bandwidth (FIGS. 12 & 23). It is also possible to choose the shape of the filter response. The drawback is that the greater the choice of filters, the larger the Look-Up Table (LUT) used to store the filter coefficients. Once again freedom of choice has to be weighted against hardware complexity.

The last operation performed by the routing algorithm is the allocation of time slots within the output sequence to accommodate the intermediate stages outputs. More details on the implementation of the output interleavers follow in the next section.

As the sample rate of every band out of the PFT is a power of two fraction of the input sample rate, it is possible to interleave all outputs from different stages within one output stream running at the full system rate. Furthermore, as long as the sum of all bands sample rate does not exceed the system rate, all bands can be accommodated in one output stream. For those familiar with wavelets, the samples are interleaved in a similar manner to that used for the output of a discrete wavelet transform (DWT).

Every stage's output stream is buffered in a circular manner, thus all bins are available at any given time (FIG. 14). For each stage buffer, an address table as well as a counter are kept, so the correct bin can be extracted when its time slot on the interleaved output becomes available.

This stores the order by which intermediate stages are interleaved onto the output stream, plus the information required for accessing the correct sample within each of the stages output buffers.

A possible hardware implementation of this subsystem is shown in FIG. 15, together with a timing diagram for the control lines (FIG. 16).

A final decision as to whether the use of two output streams is required, needs to be based on the balance between reducing hardware complexity and the typical bandwidth occupancy of the application in which the TPFT is used.

The invention claimed is:

1. Apparatus for frequency content separating an input signal, said apparatus comprising:
a series of frequency separating stages with said input signal connected to an input of a first stage and an output of each of said stages, except for the last of said stages, connected to an input of a following stage and the output of the final stage providing said frequency content separated input signal, each frequency separating stage including at least one complex frequency shifting converter operable to receive a complex input signal representing an input bandwidth extending from −Fs/2 to +Fs/2 and to output a first frequency shifted complex output signal representing an upper portion of said input bandwidth and a second frequency shifted complex output signal representing a lower portion of said input bandwidth, wherein
at least one complex frequency shifting converter, in at least one of said plurality of frequency separating stages, is configured to act as a tuneable complex frequency shifting converter having a frequency shifting characteristic for outputting a frequency shifted complex output signal representing a portion of said input bandwidth centred other than at −Fs/4 or +Fs/4.

2. Apparatus as claimed in claim 1, wherein said tuneable complex frequency shifting converter has a frequency shifting characteristic operable to output a frequency shifted complex output signal representing a portion of said input bandwidth having an output bandwidth between Fs/2 and 3Fs/4.

3. Apparatus as claimed in claim 1, wherein said plurality of frequency separating stages are operable to generate a plurality of output signals each bearing one or more target carrier signals, said plurality of output signals respectively representing portions of said input bandwidth which at least one of:
differ in size; and
are non-contiguous.

4. Apparatus as claimed in claim 3, wherein said plurality of output signals are passed through respective fine tuning stages that serve to extract said target carrier signals.

5. Apparatus as claimed in claim 1, wherein between frequency separating stages frequency shifted complex output signals are decimated and interleaved for subsequent processing.

6. Apparatus as claimed in claim 1, wherein said tuneable frequency shifting complex converter includes a local oscillator operable to generate one or more time varying coefficient signals by which sample values forming said input signal are multiplied as part of frequency separation.

7. Apparatus as claimed in claim 6, wherein said local oscillator is operable to generate a selectable one of a plurality of different streams of time varying coefficient signals each corresponding to a different local oscillator frequency and operable to separate a different portion of said input bandwidth.

8. Apparatus as claimed in claim 1, wherein said tuneable frequency shifting complex converter is one of:
a tuned complex up-converter; and
a tuned complex down-converter.

9. Apparatus as claimed in claim 1, wherein one or more of said plurality of frequency separating stages includes a complex up-converter and a complex down-converter pair that together are operable to separate a complex input signal into an upper frequency portion and a lower frequency portion being substantially contiguous and of equal size.

10. A method selecting operating characteristics of a plurality of frequency separating stages within an apparatus as claimed in claim 1, said method comprising the steps of:
determining whether two target signals require extracting from any final frequency separating stage, and if so providing two fine tuning elements for those final frequency separating stages;
determining a number of frequency separating stages required to separate all target signals;
generating local oscillator coefficient values for each frequency separating stage;
generating fine-tuning local oscillator coefficient values for any fine tuning elements within final frequency separating stages; and
selecting a band shaping filter to be applied to each target signal.

* * * * *